United States Patent
Kim et al.

(10) Patent No.: US 12,244,257 B2
(45) Date of Patent: Mar. 4, 2025

(54) MOTOR CONTROL DEVICE AND METHOD THEREFOR

(71) Applicant: LG INNOTEK CO., LTD., Seoul (KR)

(72) Inventors: Jang Hoon Kim, Seoul (KR); Won Kyu Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 92 days.

(21) Appl. No.: 18/266,131

(22) PCT Filed: Dec. 9, 2021

(86) PCT No.: PCT/KR2021/018694
§ 371 (c)(1),
(2) Date: Jun. 8, 2023

(87) PCT Pub. No.: WO2022/131686
PCT Pub. Date: Jun. 23, 2022

(65) Prior Publication Data
US 2024/0030842 A1    Jan. 25, 2024

(30) Foreign Application Priority Data

Dec. 17, 2020  (KR) .................. 10-2020-0177280
Dec. 22, 2020  (KR) .................. 10-2020-0180636

(51) Int. Cl.
*H02P 3/26*       (2006.01)
*H02P 23/14*      (2006.01)
(Continued)

(52) U.S. Cl.
CPC ............. *H02P 3/26* (2013.01); *H02P 23/14* (2013.01); *H02P 23/24* (2016.02); *H02P 25/086* (2013.01); *H02P 29/024* (2013.01)

(58) Field of Classification Search
CPC .. H02P 3/26; H02P 23/14; H02P 23/24; H02P 25/086; H02P 29/024;
(Continued)

(56) References Cited

U.S. PATENT DOCUMENTS 5,820,349 A     10/1998  Caillat
9,667,182 B2 *  5/2017   Winker ..................... H02P 6/14

FOREIGN PATENT DOCUMENTS

JP    2001-054292     2/2001
JP    2010-161875     7/2010
(Continued)

OTHER PUBLICATIONS

International Search Report dated Mar. 23, 2022 issued in Application No. PCT/KR2021/018694.

*Primary Examiner* — David Luo
(74) *Attorney, Agent, or Firm* — KED & ASSOCIATES, LLP

(57) ABSTRACT

A motor control method according to an embodiment of a present invention comprises the steps of: performing three-phase commutation in a first range section of a motor rotational speed in a brake mode of a motor; performing two-phase commutation in a second range section of the motor rotational speed performing one-phase commutation in a first range section of the motor rotational speed; and turning off commutation when the motor rotational speed is less than or equal to the first range section.

20 Claims, 18 Drawing Sheets

(51) Int. Cl.
*H02P 23/24* (2016.01)
*H02P 25/086* (2016.01)
*H02P 29/024* (2016.01)

(58) Field of Classification Search
CPC .......... H02P 2203/03; H02P 6/24; H02P 3/18; H02H 7/093; H02H 7/09; G01R 31/343
USPC ................................................ 318/701, 700
See application file for complete search history.

(56) References Cited

FOREIGN PATENT DOCUMENTS

| | | |
|---|---|---|
| JP | 2018-098974 | 6/2018 |
| WO | WO 2019-026503 | 2/2019 |

\* cited by examiner

MOTOR CONTROL DEVICE AND METHOD THEREFOR

CROSS-REFERENCE TO RELATED PATENT APPLICATIONS

This application is a U.S. National Stage Application under 35 U.S.C. § 371 of PCT Application No. PCT/KR2021/018694, filed Dec. 9, 2021, which claims priority to Korean Patent Application Nos. 10-2020-0177280, filed Dec. 17, 2020, and 10-2020-0180636, filed Dec. 22, 2020, whose entire disclosures are hereby incorporated by reference.

TECHNICAL FIELD

The present invention relates to a motor control device and a method thereof, and more particularly, relates to a motor control method and motor control device for performing a motor brake mode through three-phase switching commutation, and a Motor control method and motor control device to initialize the position of the motor using a gate signal and motor current.

BACKGROUND ART

The shift by wire (SBW) system applied to the vehicle uses a switched reluctance motor (SRM) and operates without a magnet. Due to the nature of the motor without a magnet, it is necessary to stop the motor by commutation to control the rotation of the motor for an abrupt stop.

There is a need for a technology that can quickly and efficiently stop the motor in case of an emergency or rapid control in a brake mode for stopping the motor.

In addition, for stable shifting, it is necessary to set the reference position of the SBW system at the time of starting a vehicle. If the reference position is not set, there is a possibility that a problem may occur during P/R/N/D shift control, which may be dangerous for stability.

For accurate shift control, a technology capable of accurately and efficiently setting a reference position is required.

DETAILED DESCRIPTION OF THE INVENTION

Technical Subject

The technical problem to be solved by the present invention is to provide a motor control method and a motor control device for performing a motor brake mode through three-phase switching commutation.

Another technical problem to be solved by the present invention is to provide a motor control method and a motor control device for initializing a position of a motor using a gate signal and a motor current.

Technical Solution

In order to solve the above technical problem, a motor control method according to a first embodiment of the present invention comprises: performing three-phase commutation in a first range section of a motor rotation speed in a brake mode of a motor; performing two-phase commutation in a second range section of the motor rotation speed; performing one-phase commutation in a first range section of the motor rotation speed; and turning off commutation when the motor rotation speed is less than or equal to the first range section.

In addition, the first range section is set above three-phase commutation sustaining speed being calculated from the motor rotation speed at the start of the brake mode and the three-phase commutation sustaining speed ratio; the second range section is set above two-phase commutation sustaining speed being calculated from the motor rotation speed at the start of the brake mode, the three-phase commutation sustaining speed ratio, and the two-phase commutation sustaining speed ratio; and the third range section can be set above one-phase commutation sustaining speed calculated from the motor rotation speed at the start of the brake mode, the three-phase commutation sustaining speed ratio, the two-phase commutation sustaining speed ratio, and the one-phase commutation sustaining speed ratio.

In addition, the three-phase commutation sustaining speed ratio may be greater than the two-phase commutation sustaining speed ratio, and the two-phase commutation sustaining speed ratio may be greater than the one-phase commutation sustaining speed ratio.

In addition, the brake mode may include a normal brake mode and an emergency brake mode.

In addition, a first range section in the emergency break mode may be larger than a first range section in the normal break mode.

In addition, the emergency brake mode may be performed by detecting any one of DC current abnormality, motor current abnormality, PWM failure, function failure, motor rotation abnormality, and signal reception of a host control unit.

In addition, during the three-phase commutation, all three MOSFETs are commutated; during the two-phase commutation, two MOSFETs that generate a reverse torque opposite to a rotational direction of a motor are commutated; and during the one-phase commutation, one MOSFET generating reverse torque opposite to a rotation direction of a motor may be commutated.

In order to solve the above technical problem, a motor control device according to a first embodiment of the present invention comprises a three-phase bridge unit including three MOSFETs operating in different phases so that the motor operates in three-phase; and a control unit for controlling the three MOSFETs, wherein during a brake mode of a motor, the control unit performs three-phase commutation in a first range section of a motor rotation speed, performs two-phase commutation in a second range section of the motor rotation speed, performs one-phase commutation in a third range section of the motor rotation speed, and turns off commutation when the motor rotation speed is less than or equal to the third range section.

In addition, the control unit sets the first range section to be greater than or equal to a three-phase commutation sustaining speed calculated from a motor rotation speed at the start of a brake mode and a three-phase commutation sustaining speed ratio; sets the second range section to be greater than or equal to the two-phase commutation sustaining speed calculated from a motor rotation speed at the start of the brake mode, the three-phase commutation sustaining speed ratio, and the two-phase commutation sustaining speed ratio; and sets the third range section to be greater than or equal to one-phase commutation sustaining speed calculated from a motor rotation speed at the start of the brake mode, the three-phase commutation sustaining speed ratio, the two-phase commutation sustaining speed ratio, and the one-phase commutation sustaining speed ratio.

In addition, the break mode may include a normal break mode and an emergency break mode, and a first range section in the emergency break mode may be larger than a first range section in the normal break mode.

In addition, the control unit may perform an emergency brake mode by detecting any one of a DC current abnormality, a motor current abnormality, a PWM failure, a function failure, a motor rotation abnormality, and a signal reception of a host control unit.

In addition, it includes a motor position measuring unit including a first sensor and a second sensor for measuring the motor position; a motor driving unit receiving a control signal from the control unit and outputting a PWM signal to the three-phase bridge unit; a power supply unit that supplies power to the control unit, receives a first motor rotation position signal from the first sensor, and transmits it to the control unit; and an input terminal protection unit that blocks the voltage supplied to the motor or detects overcurrent, wherein the control unit receives a second motor rotation position signal from the second sensor and determines a functional failure by comparing it with the first motor rotation position signal received from the power supply unit; or detects an abnormal DC current from the input terminal protection unit; or detects motor current abnormality from the three MOSFETs; or detects a PWM failure from the motor driving unit; or may perform an emergency brake mode when detecting a motor rotation abnormality from the power supply unit.

In order to solve the above technical problem, a motor control method according to the second embodiment of the present invention comprises the steps of: aligning the rotor of the motor; rotating the motor in one direction; determining whether a current gate signal is the same as a previous gate signal; setting a reference current according to the number of gate signals currently in a High state; sensing a motor current and comparing the sensed motor current with the reference current; and setting the current position as a reference position of the motor when the difference between the motor current and the reference current is less than a first threshold, wherein the gate signal is a gate signal applied to a three-phase FET operating in three phases to drive the motor.

In addition, when the difference between the motor current and the reference current is greater than the first threshold value, it may be determined that the motor or the control unit has failed.

In addition, the method may include performing shift control based on the reference position according to a shift command inputted from the driver.

In addition, it may include the steps of: comparing a first shift position being measured and a second shift position received from an inhibitor switch signal by a position sensor measuring the position of the motor; and completing the shift when the difference between the first shift position and the second shift position is less than a second threshold value.

In addition, if the difference between the first shift position and the second shift position is greater than the second threshold value, the steps may be repeated from the step of rotating the motor in one direction to the step of setting the current position as the reference position of the motor.

In addition, it may include a step of determining that the position sensor or the inhibitor switch is faulty when the number of repetitions of the steps from the step of rotating the motor in one direction to the step of setting the current position as a reference position of the motor is more than a preset number of times.

In addition, the step of aligning the rotor of the motor may be performed when the vehicle is started.

In addition, the step of aligning the rotor of the motor may include a step of turning on at least one FET among three-phase FETs operating in three phases.

In addition, the step of determining whether a current gate signal is the same as a previous gate signal may determine whether the current gate signal is the same as the previous gate signal by individually determining the gate signal of each phase.

In addition, the determining whether a current gate signal is the same as a previous gate signal may include a step of determining whether a current gate signal is maintaining the same state as a previous gate signal for a preset time.

In addition, the step of rotating the motor in one direction may rotate the motor clockwise or counterclockwise.

In order to solve the above technical problem, a motor control device according to the second embodiment of the present invention comprises: a three-phase FET operating in three phases to drive a motor that performs gear shifting; and a control unit that controls the three-phase FET, wherein the control unit aligns the rotor of the motor, rotates the motor in one direction, determines whether a gate signal of the current three-phase FET is the same as the previous gate signal, sets the reference current according to the number of gate signals that are currently in High state, senses the motor current, compares a motor current that has been sensed with the reference current, and sets the current position as the reference position of the motor when the difference between the motor current and the reference current is less than a first threshold value.

In addition, the control unit may determine as the motor or the control unit is faulty when the difference between the motor current and the reference current is greater than the first threshold value.

In addition, the control unit may perform shift control based on the reference position according to a shift command inputted from a driver.

In addition, a position sensor for measuring the position of the motor is included, wherein the control unit can complete the shift when the difference between the first shift position and the second shift position is smaller than a second threshold value by comparing a first shift position measured by the position sensor and a second shift position received from the inhibitor switch signal.

In addition, the control unit repeats from the process of aligning the motor to the process of setting the current position as the reference position of the motor when the difference between the first shift position and the second shift position is greater than the second threshold value, and may determine as the position sensor or the inhibitor switch is faulty when the number of repetitions from the process of aligning the motor to the process of setting the current position as the reference position of the motor is greater than or equal to the preset number.

In addition, the control unit may align the rotor of the motor by turning on one or more FETs of the three-phase FETs when the vehicle is started.

In addition, the control unit may determine whether the current gate signal maintains the same state as the previous gate signal for a preset time by individually determining the gate signal of each phase.

Advantageous Effects

According to embodiments of the present invention, it is possible to brake the motor quickly and efficiently. In addition, compared to the conventional two-phase fixed commutation, the total current consumption is small, so damage and loss of the device can be reduced, and since the stopping time is smaller than the existing two-phase fixed commutation, it is suitable for emergency braking or to improve response characteristics, and furthermore, it is possible to effectively enter the safety state of functional safety and implement safety mechanism technology that can satisfy ASIL-B or higher.

According to embodiments of the present invention, it is possible to accurately set the reference position of the motor. In addition, it can be applied regardless of the type of position sensor or current sensor, and it is possible to determine the failure of the control unit (SCU) or motor by comparing the change amount of the gate signal and the reference current. Furthermore, it can determine the failure of the position sensor or inhibitor switch by comparing the position sensor value obtained from the reference position and the inhibitor switch signal, during gear shifting.

Through this, the motor can be controlled accurately and safely without using an expensive dual die position sensor, a position sensor equipped with a self-failure determination function, and an IC with a position sensor failure determination function.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
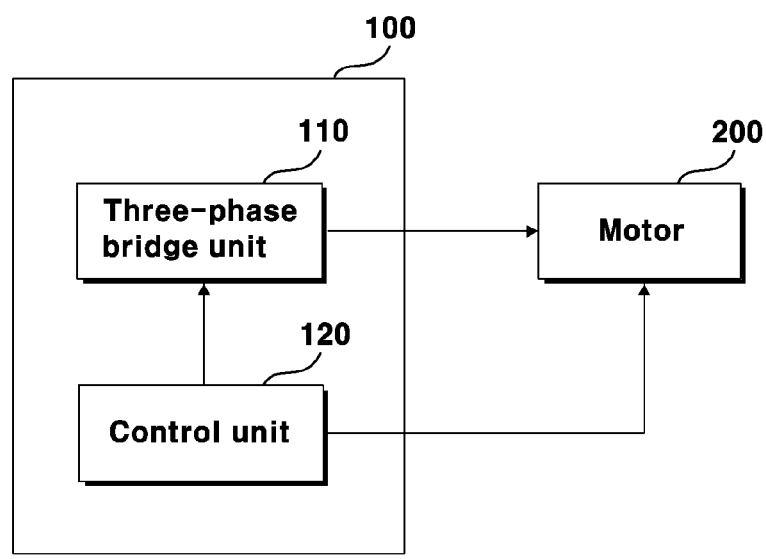
FIG. 1 is a block diagram of a motor control device according to a first embodiment of the present invention.

FIG. 1 is a block diagram of a motor control device according to a first embodiment of the present invention.

The motor control device 100 according to the first embodiment of the present invention comprises a three-phase bridge unit 110 and a control unit 120, and may be configured with a motor position measuring unit 130, a motor driving unit 140, a power supply unit 150, and an input terminal protection unit 160, and may include a connector (not shown) for transmitting and receiving a signal to and from the motor 200 or the outside.

The motor control device 100 according to a first embodiment of the present invention may be a motor control device that drives or brakes the motor 200 and forms a shift by wire system (hereinafter referred to as SBW). The SBW is configured with a switched reluctance motor (hereinafter referred to as SRM) and an SBW control unit (SCU), and the SRM and the SCU may be integrally formed. SRM and SCU may be configured independently. The motor control device 100 according to a first embodiment of the present invention may operate as an SCU constituting the SBW.

Figure 2:
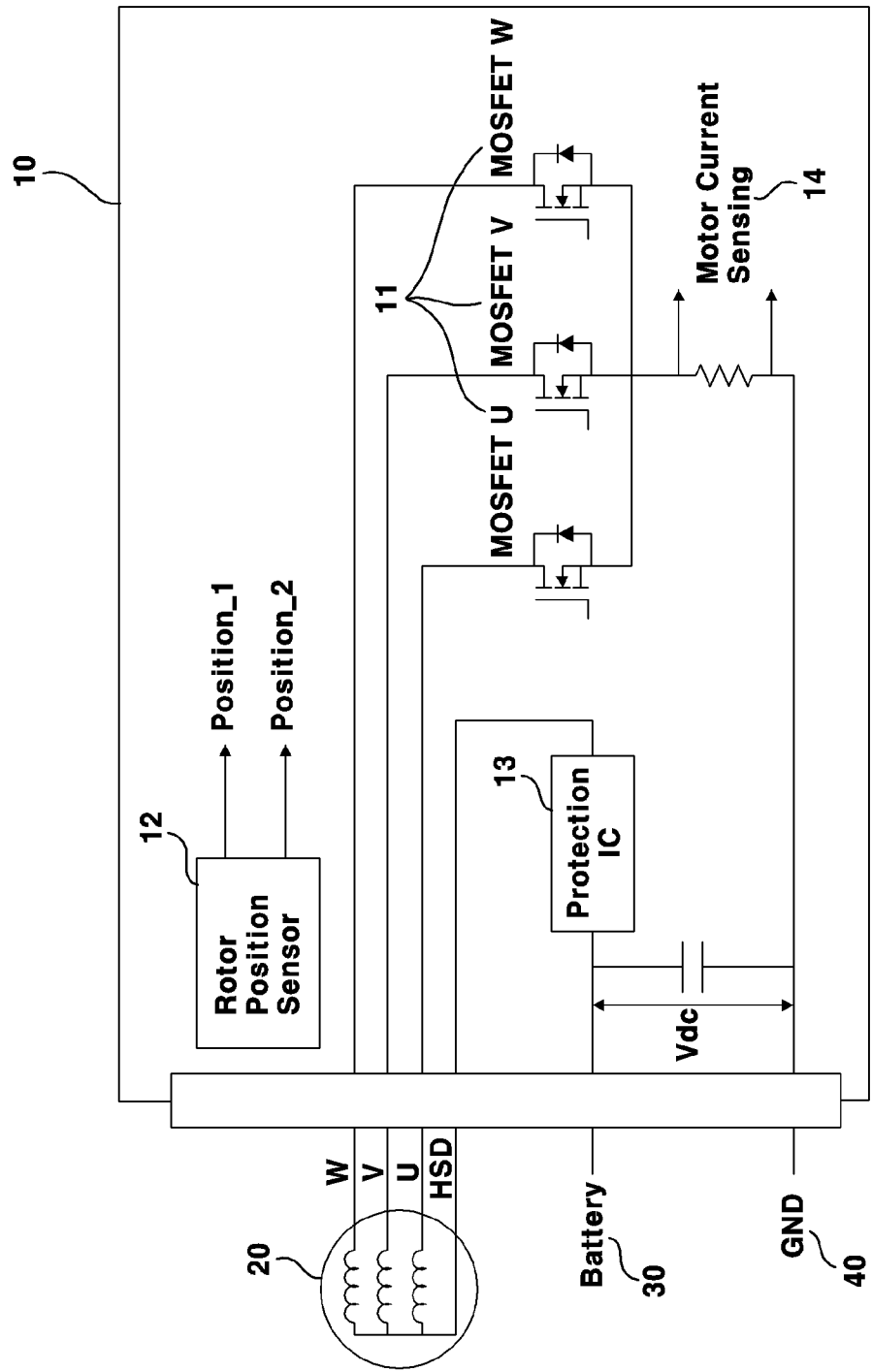
FIG. 2 is a circuit diagram for explaining an operation of the motor control device according to a first embodiment of the present invention.

The SBW may be configured as shown in FIG. 2. It may be configured with an SCU 10 to control an SRM 20. The SCU 10 may be configured with three FETs 11, 11, and 11 that commutate the SRM 20, and the three FETs may be configured with a three-phase bridge operating in different phases U, V, and W. The SCU 10 receives the battery power 30 to be inputted to the SRM 20. At this time, in order to protect the SRM 20 or internal components, a protection IC 13 may be included. The SRM 20 is driven by the input power, and may be driven according to the commutation of the three FETs 11, 11, and 11. At this time, the motor current flowing according to the commutation of the three FETs 11, 11, and 11 may be sensed (14) and used to determine whether there is a failure. In addition, it may include a position measuring sensor 12 for measuring the position of the SRM 20. The position measuring sensor 12 may be composed of two MR sensors formed of a dual die, and stability may be improved by using the respective position information.

The three-phase bridge unit 110 of the motor control device 100 according to an embodiment of the present invention includes three MOSFETs operating in different phases so that the motor operates in three-phase, and the control unit 120 controls 3 MOSFETs.

The three MOSFETs are turned on and off in different phases (U-phase, V-phase, and W-phase) to form a torque capable of rotating the motor 200, thereby driving the motor 200. In a brake mode for braking the motor 200, the three MOSFETs are turned on and off so that a reverse torque is generated in the reverse direction to the direction in which the motor 200 is rotating to perform the motor brake mode.

The control unit 120 may drive or brake the motor 200 by controlling the commutation of three MOSFETs. In the brake mode of the motor, for an efficient and fast braking, the control unit 120 performs three-phase commutation in the first range section of motor rotation speed, performs two-phase commutation in the second range section of the motor rotation speed, performs one-phase commutation in the first range section of the motor rotation speed, and may be turned off commutation when the motor rotation speed is less than or equal to the first range section. When performing motor brake mode, first, the motor rotation speed is reduced with three-phase commutation when the motor rotation speed is below a certain speed, the motor rotation speed is reduced through two-phase commutation when the motor rotation speed is below a certain speed, the motor rotation speed is reduced through one-phase commutation, and finally, turn off commutation when the motor stops or the motor rotation speed falls below a certain speed. Efficient and fast braking is possible by performing brake mode through three-phase, two-phase, and one-phase switching commutation.

The control unit 120 sets the first range section to be greater than or equal to a three-phase commutation sustaining speed calculated from a motor rotation speed at the start of brake mode and the three-phase commutation sustaining speed ratio; sets the second range section to be greater than or equal to a two-phase commutation sustaining speed calculated from the motor rotation speed at the start of the brake mode, the three-phase commutation sustaining speed ratio, and a two-phase commutation sustaining speed ratio; and may set the third range section to be greater than or equal to an one-phase commutation sustaining speed calculated from the motor rotation speed at the start of the brake mode, the three-phase commutation sustaining speed ratio, the two-phase commutation sustaining speed ratio, and the one-phase commutation sustaining speed. Each of the first range section, the second range section, and the third range section is being set using the sustaining speed to determine whether to switch or to turn off commutation, respectively.

Figure 3:
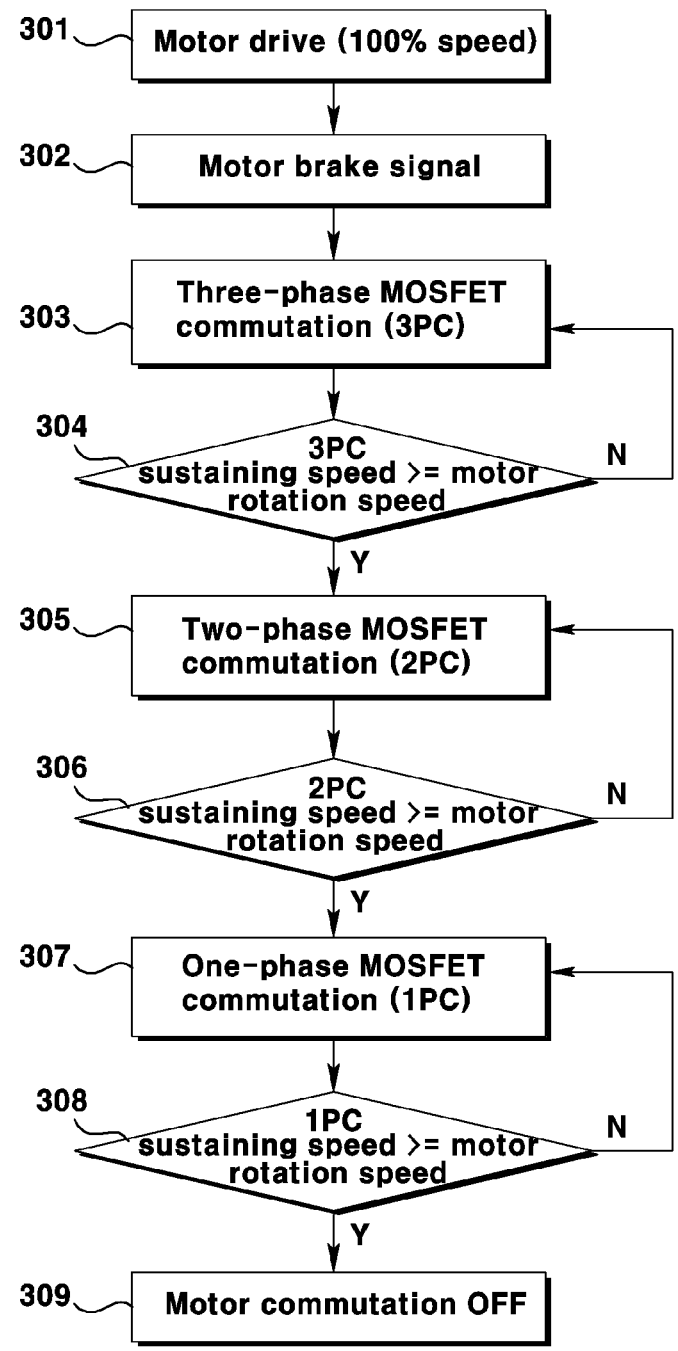
FIGS. 3 to 6 are drawings for explaining the operation of the motor control device according to a first embodiment of the present invention.

As shown in FIG. 3, when a motor brake signal (302) is inputted during motor driving (301) or a motor brake mode operation is required due to a failure or an occurrence of an abnormality, First, three-phase commutation is performed, that is, three-phase MOSFETs U, V, and W are all commutated. PC stands for phase commutation which means commutation. The motor rotation speed is reduced through three-phase commutation, and the first range section performing three-phase commutation is set using the three-phase commutation sustaining speed. Three-phase commutation is maintained until the first range section, that is, the motor rotation speed falls below the three-phase commutation sustaining speed. The three-phase commutation sustaining speed that sets the first range section is calculated from a motor rotation speed at the start of the brake mode and a three-phase commutation sustaining speed ratio. The three-phase commutation sustaining speed ratio means a ratio, in the process of lowering the motor rotation speed to the speed at the start of the brake mode and the speed zero at the stop during the brake mode, that sets whether the three-phase commutation is to be maintained until the motor rotation speed is lowered to a certain speed.

When the motor rotation speed falls below the first range section, that is, three-phase commutation sustaining speed through three-phase commutation, two-phase commutation is performed. In the case of two-phase commutation, it is possible to commutate two MOSFETs that generate a reverse torque opposite to the rotational direction of the motor. At this time, the MOSFET U-V, V-W, or U-W may be commutated.

To reduce the motor rotation speed through two-phase commutation, the second range section performing two-phase commutation is set using a two-phase commutation sustaining speed. After performing two-phase commutation, two-phase commutation maintains until the second range section, that is, the motor rotation speed falls below the two-phase commutation sustaining speed.

The two-phase commutation sustaining speed setting the second range section is calculated from the motor rotation speed at the start of the brake mode, the three-phase commutation sustaining speed ratio, and the two-phase commutation sustaining speed ratio. The two-phase commutation sustaining speed ratio means a ratio, in the process of lowering the motor rotation speed to the speed at the start of the brake mode and the speed zero at the stop during the brake mode, that sets whether the two-phase commutation is to be maintained until the motor rotation speed is lowered to a certain speed.

When the motor rotation speed increases abnormally during two-phase commutation, after switching from three-phase commutation to two-phase commutation, two-phase commutation can be maintained without switching back to three-phase commutation. Or, to brake the motor using three-phase commutation, it may be switched back to three-phase commutation. At this time, three-phase commutation sustaining speed can be used for the switching speed to three-phase commutation. That is, when the motor rotation speed becomes higher than the three-phase commutation sustaining speed, it can be switched to three-phase commutation. Or, when switching from two-phase commutation to three-phase commutation, a speed higher than the three-phase commutation sustaining speed may be applied. For example, when a margin value is added to the three-phase commutation sustaining speed, or the speed is increased by a certain ratio and the speed becomes higher than the corresponding speed, it may be switched to three-phase commutation.

Through two-phase commutation, when a motor rotation speed falls below the second range section, that is, the two-phase commutation sustaining speed, one-phase commutation is performed. During one-phase commutation, it is possible to commutate one MOSFET that generates a reverse torque opposite to the rotational direction of the motor. At this time, one of the MOSFETs U, V, or W can be commutated. The motor rotation speed is reduced through one-phase commutation, and the third range section performing one-phase commutation is set using one-phase commutation sustaining speed. After performing one-phase commutation, one-phase commutation is maintained until the third range section, that is, the motor rotation speed falls below the one-phase commutation sustaining speed. The one-phase commutation sustaining speed setting the second range section is calculated from the motor rotation speed at the start of the brake mode, the three-phase commutation sustaining speed ratio, the two-phase commutation sustaining speed ratio, and one-phase commutation sustaining speed ratio. The one-phase commutation sustaining speed ratio means a ratio, in the process of lowering the motor rotation speed to the speed at the start of the brake mode and the speed zero at the stop during the brake mode, that sets whether the one-phase commutation is to be maintained until the motor rotation speed is lowered to a certain speed.

When the motor rotation speed increases abnormally during one-phase commutation, after switching from two-phase commutation to one-phase commutation, one-phase commutation can be maintained without switching back to two-phase commutation. Or, to brake the motor using two-phase commutation, it may be switched back to two-phase commutation. At this time, two-phase commutation sustaining speed can be used for the switching speed to two-phase commutation. That is, when the motor rotation speed becomes higher than the two-phase commutation sustaining speed, it can be switched to two-phase commutation. Or, when switching from one-phase commutation to two-phase commutation, a speed higher than the two-phase commutation sustaining speed may be applied. For example, when a margin value is added to the two-phase commutation sustaining speed, or the speed is increased by a certain ratio and the speed becomes higher than the corresponding speed, it may be switched to two-phase commutation.

The three-phase commutation sustaining speed ratio, the two-phase commutation sustaining speed ratio, and the one-phase commutation sustaining speed ratio may be set by the user or may vary depending on the type of brake mode or the motor rotation speed at the start of the brake mode.

The three-phase commutation sustaining speed ratio can be set larger than the two-phase commutation sustaining speed ratio, and the two-phase commutation sustaining speed ratio can be set larger than the one-phase commutation sustaining speed ratio. Three-phase commutation consumes more current than two-phase commutation, but is effective for the brake, and two-phase commutation also consumes more current than one-phase commutation and is more effective for the brake. Therefore, for an efficient and fast brake, the phase commutation sustaining speed ratio may be greater than the two-phase commutation sustaining speed ratio, and the two-phase commutation sustaining speed ratio may be set greater than the one-phase commutation sustaining speed ratio. Or, depending on the user's settings or environmental factors, and the like, between the same ratio and three-phase commutation sustaining speed ratio may be set to be smaller than the two-phase commutation sustaining speed ratio, and the two-phase commutation sustaining speed ratio is smaller than the one-phase commutation sustaining speed ratio.

For example, the three-phase commutation sustaining speed ratio may be set between 70 and 30%, the two-phase commutation sustaining speed ratio may be set between 50 and 20%, and the one-phase commutation sustaining speed ratio may be set between 30 and 0%. When the one-phase commutation maintenance ratio is set to 0%, it may mean that the motor is stopped by three-phase commutation and two-phase commutation. The sum of the three-phase commutation sustaining speed ratio, the two-phase commutation sustaining speed ratio, and the one-phase commutation sustaining speed ratio may be 100% or less than 100%. If the sum is 100%, it means that the commutation is maintained until the motor stops. That is, when the rotational speed of the motor falls below a safe speed, commutation may be turned off.

The three-phase commutation sustaining speed, the two-phase commutation sustaining speed, and the one-phase commutation sustaining speed can be calculated as follows.

Three-phase commutation sustaining speed=(100%−three-phase commutation sustaining speed ratio)×motor rotational speed Two-phase commutation sustaining speed={100%−(three-phase commutation sustaining speed ratio+two-phase commutation sustaining speed ratio)}×motor rotational speed One-phase commutation sustaining speed={100%−(three-phase commutation sustaining speed ratio+two-phase commutation sustaining speed ratio+one-phase commutation sustaining speed ratio)}×motor rotational speed For example, when the motor rotation speed is 1000 rpm, the three-phase commutation sustaining speed ratio is 50%, the two-phase commutation sustaining speed ratio is 30%, and the one-phase commutation sustaining speed ratio is 20%, the three-phase commutation sustaining speed, two-phase commutation sustaining speed, and one-phase commutation sustaining speed can be calculated as follows.

Three-phase commutation sustaining speed=(100%−50%)×1000 rpm=500 rpm

Two-phase commutation sustaining speed={100%−(50+30)%}×1000 rpm=200 rpm

One-phase commutation sustaining speed={100%−(50+30+20)%}×1000 rpm=0 rpm

Figure 4:
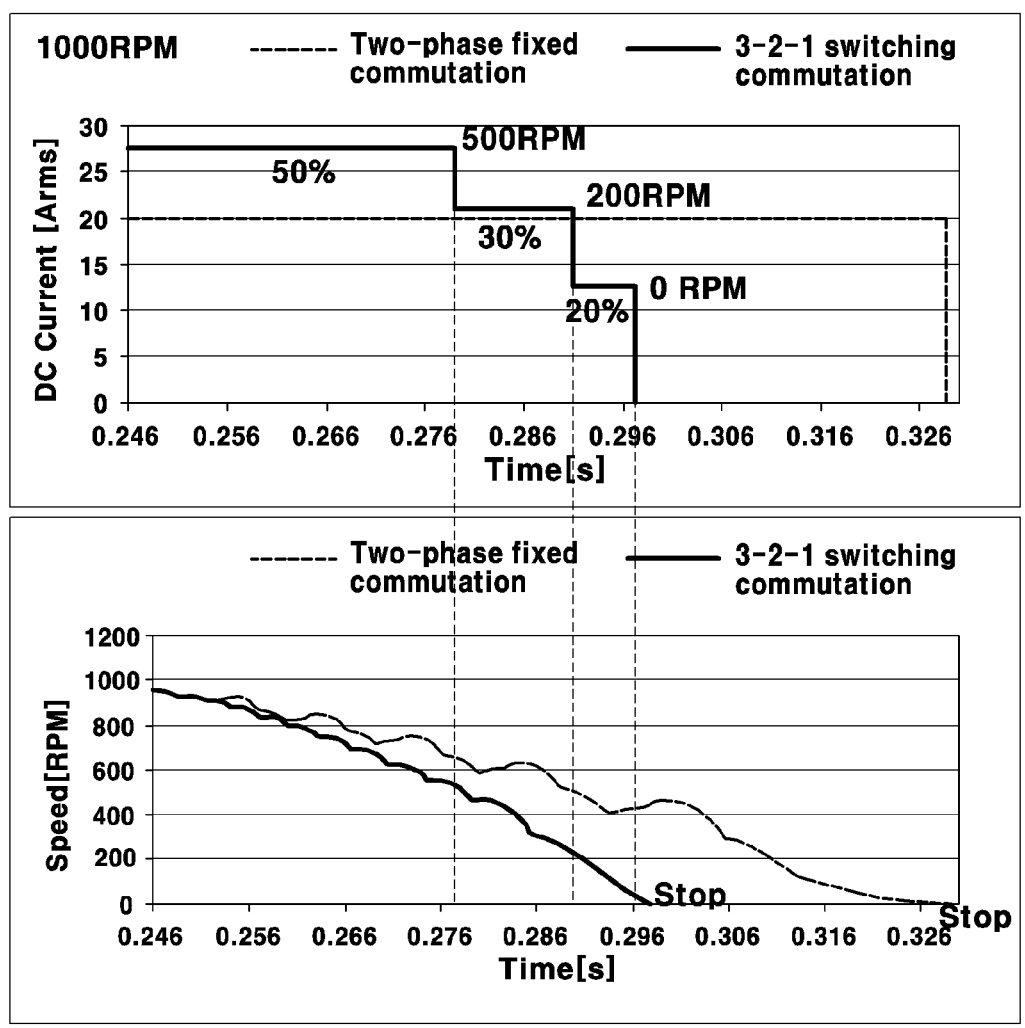

In this way, when performing the brake mode, as shown in FIG. 4, three-phase commutation is performed starting from 1000 rpm to 500 rpm, as in 3-2-1 switching commutation, and at 500 to 200 rpm, two-phase commutation is performed, and at 200 to 0 rpm, one-phase commutation is performed to stop the motor. After that, commutation is turned off. It can be seen that the total current consumption is smaller in 3-2-1 switching commutation compared to two-phase fixed commutation in which two-phase commutation is fixed. In FIG. 4, it is 1.62 Coulomb at the time of two-phase fixed commutation, whereas it is reduced to 1.22 Coulomb at the time of 3-2-1 switching commutation, so that damage and loss of the device can be reduced. In addition, as shown in the graph below, the time to stop is shortened so that the motor can be stopped quickly, so that emergency brake or response characteristics can be improved.

The brake mode may include a normal brake mode and an emergency brake mode. An emergency brake mode for urgently braking the motor in an emergency situation can be set differently from a general brake mode that brakes the motor in a normal general situation. The first range section in the emergency brake mode may be set to be larger than the first range section in the general brake mode.

In a general brake mode, each sustaining speed ratio can be set as follows.

Three-phase commutation sustaining speed ratio: 50±5%
Two-phase commutation sustaining speed ratio: 30±5%
One-phase commutation sustaining speed ratio: 20±5%

In an emergency brake mode, the three-phase normal sustaining speed ratio can be set larger than in a general brake mode, and accordingly, each sustaining speed ratio can be set as follows.

Three-phase commutation sustaining speed ratio: 70±5%
Two-phase commutation sustaining speed ratio: 20±5%
One-phase commutation sustaining speed ratio: 10±5%

The control unit 120 may perform an emergency brake mode by detecting any one of a DC current abnormality, a motor current abnormality, a PWM failure, a function failure, a motor rotation abnormality, and a signal reception of a host control unit. The control unit 120 may monitor the case of performing the emergency brake mode, and may perform the emergency brake mode when a corresponding situation is detected.

In monitoring whether to perform an emergency brake mode, monitoring may be performed using other configurations in addition to the control unit 120 for a rapid detection.

Figure 5:
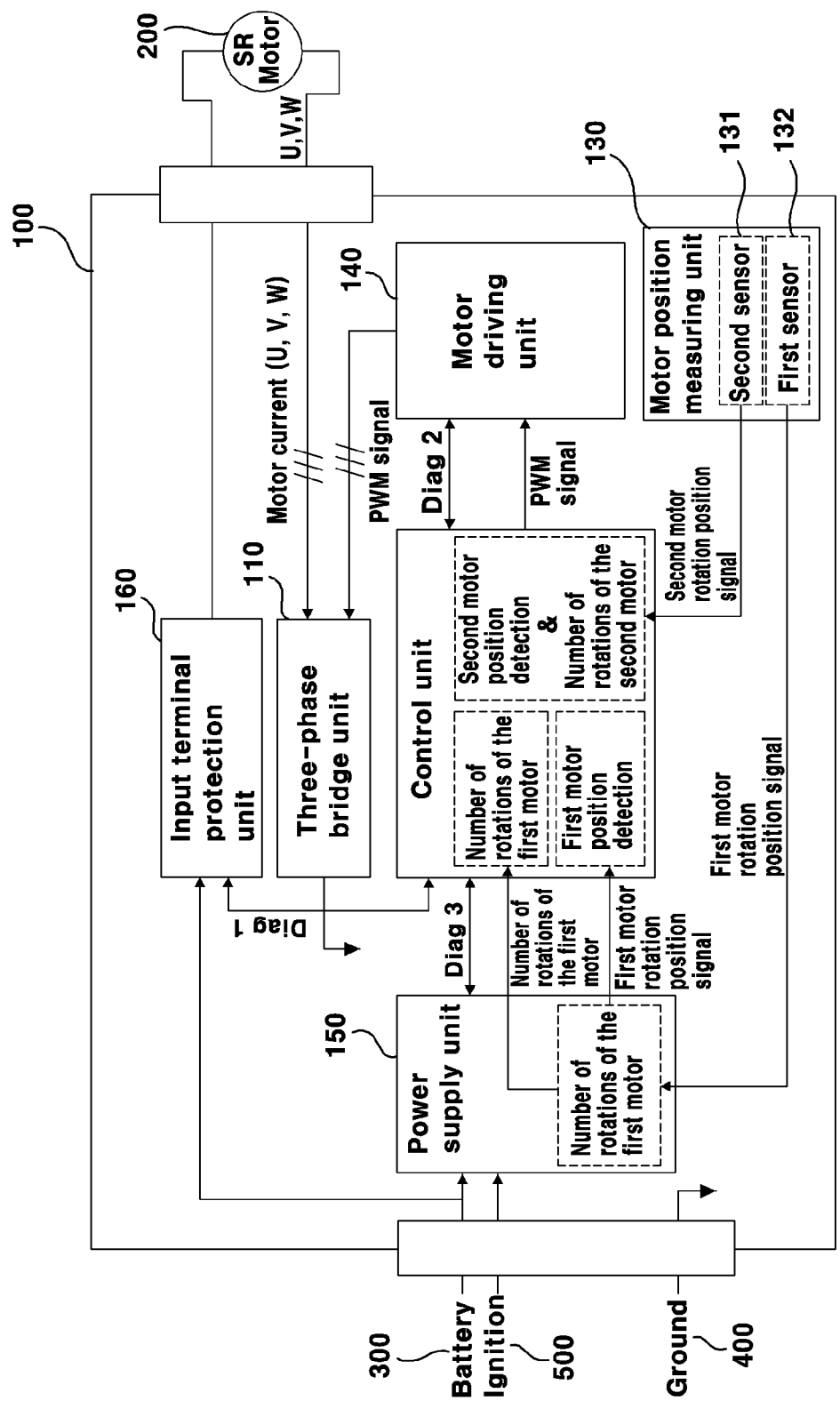

As shown in FIG. 5, a motor control device 100 according to an embodiment of the present invention may include a motor position measuring unit 130, a motor driving unit 140, a power supply unit 150, and an input terminal protection unit 160.

The motor position measuring unit 130 includes a first sensor 132 and a second sensor 131 for measuring the position of the motor 200. The first sensor 132 and the second sensor 131 may be implemented as MR sensors of a dual die.

The motor driving unit 140 receives a control signal from the control unit 120 and outputs a PWM signal to the three-phase bridge unit 110. The motor driving unit 140 may be a motor driver capable of self-diagnosis, and serves to output a PWM signal to the gate signal of each MOSFET of the three-phase bridge unit 110, and can immediately detect whether the PWM signal is abnormal.

The power supply unit 150 receives the battery power 300 and the ignition 500 to supply power to the control unit 120, and may receive the first motor rotation position signal from the first sensor 132 to transmit to the control unit 120. The power supply unit 150 may be configured as a power supply IC capable of monitoring Micom and MR sensors, and self-diagnosing a failure. The power supply unit 150 may receive the first motor rotation position signal from the first sensor 132 to monitor the first motor rotation speed, and may quickly detect an abnormality in motor rotation.

The input terminal protection unit 160 may block the voltage supplied to the motor 200 or detect an overcurrent. The input terminal protection unit 160 may block the battery voltage supplied to the motor and may be configured as a protection IC capable of self-detecting an overcurrent. The input terminal protection unit 160 is located at the input terminal for inputting the battery power 300 to the motor 200 and monitors the DC current to immediately detect an abnormality in the DC current.

In addition, as a motor current flows through the three-phase bridge unit 110, an abnormality in the motor current can be immediately detected by monitoring the motor current.

The control unit 120 may receive a second motor rotation position signal from the second sensor 131 and determine the functional failure by comparing it with a first motor rotation position signal received from the power supply unit 150. The control unit 120 may perform an emergency brake mode when detecting an abnormality in a DC current from the input terminal protection unit 160, or detecting an abnormality in a motor current from the three-phase bridge unit 110 of three MOSFETs, or detecting a PWM failure from the motor driving unit 140, or detecting an abnormality in a motor rotation from the power supply unit 150. Or, when receiving the emergency brake entry signal from the host control unit, an emergency brake mode may be performed.

Figure 6:
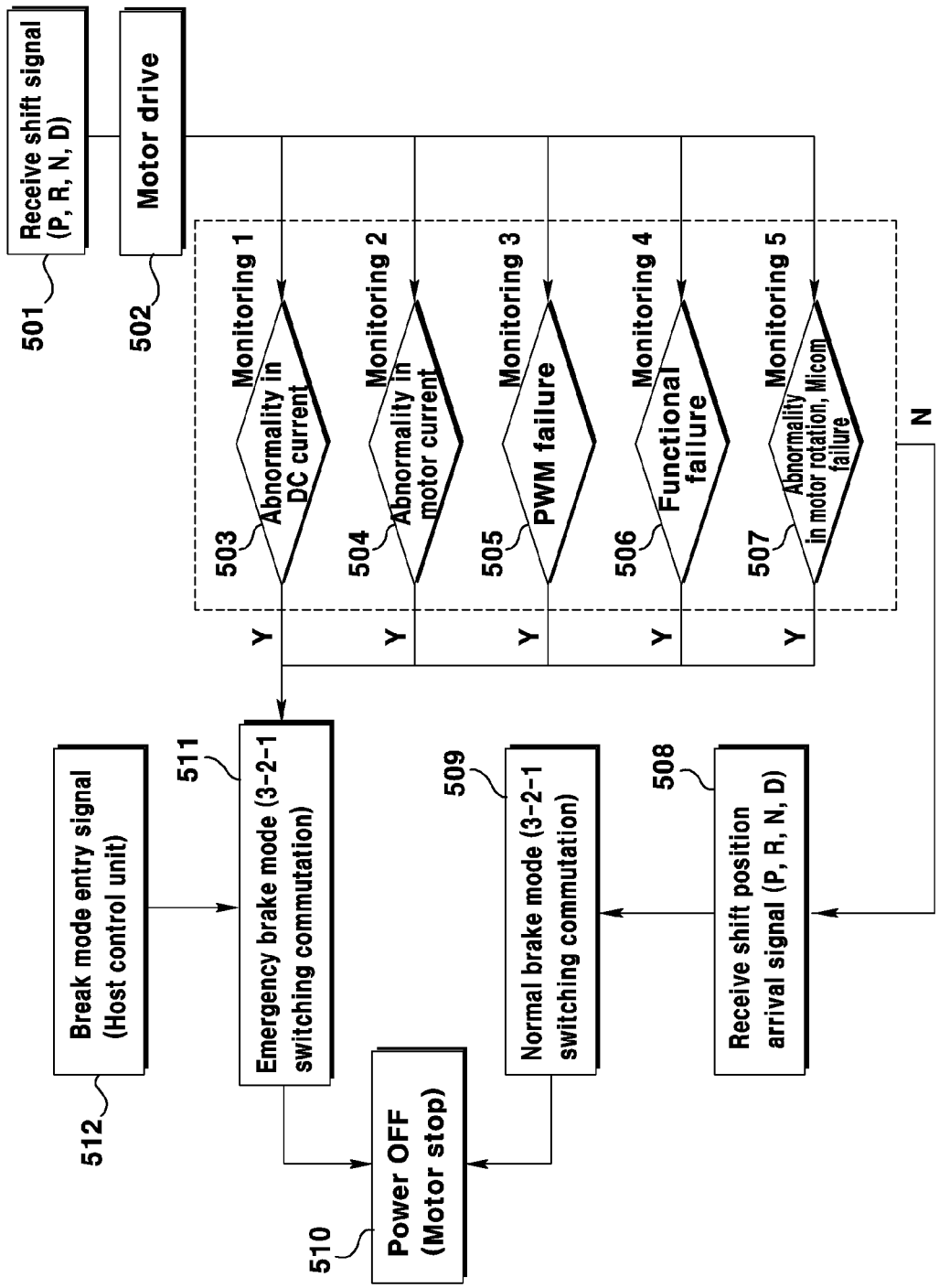

As shown in FIG. 6, when a shift signal is received (501), the motor is driven (502) for shifting, monitoring of an abnormality in DC current (503), monitoring of an abnormality in motor current (504), monitoring of a failure in PWM (505), monitoring of a functional failure (506), monitoring of an abnormality in motor rotation or monitoring of a failure in Micom (507) are performed while driving the motor. At this time, when no abnormality is detected and when the shift position arrival signal is received (508), a normal brake mode is performed (509) to stop the motor at the corresponding position. When 3-2-1 switching commutation is performed and the motor stops, commutation is turned off (510). When an abnormality is detected during the monitoring process, an emergency brake mode is performed (511). 3-2-1 switching commutation is performed. At this time, the three-phase commutation sustaining speed ratio is set higher than that of the general brake mode to perform switching commutation. When the motor stops, commutation is turned off (510). Even if no abnormality is detected during the monitoring process, when a brake mode entry signal is received from the host control unit (512), the emergency brake mode is performed (511). 3-2-1 switching commutation is performed, and again, switching commutation is performed by setting the three-phase commutation sustaining speed ratio larger than that in the general brake mode. When the motor stops, commutation is turned off (510).

Self-diagnosis for safe operation is possible through detection in each configuration and comparison of the motor rotation position signals of two sensors. Through this, it is possible to effectively enter the safety state of functional safety and implement a safety mechanism that satisfies ASIL-B or higher.

Figure 7:
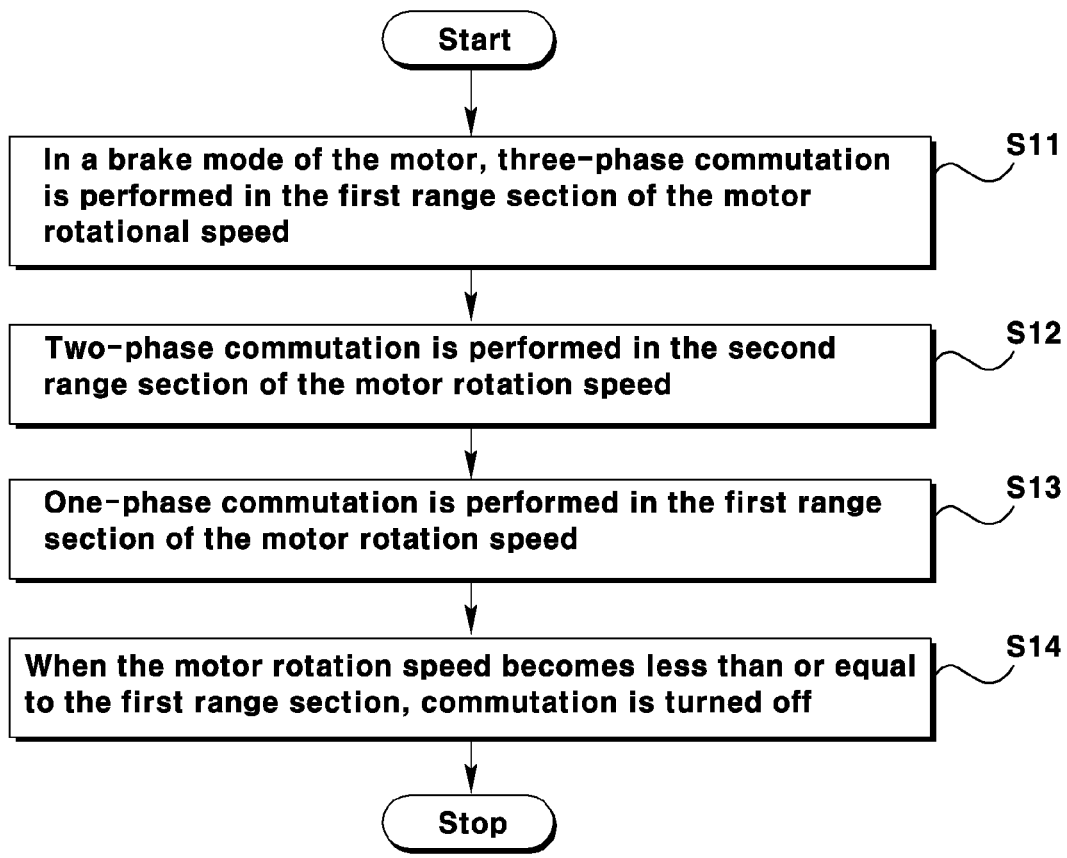
FIG. 7 is a flowchart of a motor control method according to a first embodiment of the present invention.

FIG. 7 is a flowchart of a motor control method according to a first embodiment of the present invention. A detailed description of the motor control method according to a first embodiment of the present invention corresponds to the detailed description of the motor control device of FIGS. 1 to 6, and thus descriptions being overlapped will be omitted.

The motor control method according to a first embodiment of the present invention performs the following steps in braking the motor in a brake mode.

In step S11, in a brake mode of the motor, three-phase commutation is performed in the first range section of the motor rotational speed. During three-phase commutation, all three MOSFETs are commutated, and the first range section is set to be higher than or equal to the three-phase commutation sustaining speed calculated from the motor rotation speed and the three-phase commutation sustaining speed ratio at the start of the brake mode.

Thereafter, when the motor rotation speed is less than or equal to the first range section, in step S12, two-phase commutation is performed in the second range section of the motor rotation speed. During two-phase commutation, two MOSFETs that generate reverse torque opposite to the rotation direction of the motor are commutated, and the second range section may be set above the two-phase commutation sustaining speed calculated from the motor rotation speed at the start of the brake mode, the three-phase commutation sustaining speed ratio, and the two-phase commutation sustaining speed ratio.

Thereafter, when the motor rotation speed is less than or equal to the second range section, one-phase commutation is performed in the first range section of the motor rotation speed in step S13. During one-phase commutation, one MOSFET that generates reverse torque opposite to the rotational direction of the motor is commutated, and the third range section may be set above one-phase commutation sustaining speed calculated from the motor rotation speed at the start of the brake mode, the three-phase commutation sustaining speed ratio, the two-phase commutation sustaining speed ratio, and the one-phase commutation sustaining speed ratio.

Thereafter, when the motor rotation speed becomes less than or equal to the first range section, commutation is turned off in step S14.

The three-phase commutation sustaining speed ratio may be greater than the two-phase commutation sustaining speed ratio, and the two-phase commutation sustaining speed ratio may be greater than the one-phase commutation sustaining speed ratio.

The brake mode may include a general brake mode and an emergency brake mode, and as the emergency brake mode requires a faster brake than the general brake mode, a first range section in the emergency brake mode may be larger than a first range section in the normal brake mode.

The emergency brake mode may be performed by detecting any one of an abnormality in DC current, an abnormality in motor current, a failure in PWM, a failure in function, an abnormality in motor rotation, and a signal reception of the host control unit.

As described above, the motor control method and the motor control device according to a first embodiment of the present invention have been described with reference to FIGS. 1 to 7. Hereinafter, a motor control method and a motor control device according to a second embodiment of the present invention will be described with reference to FIGS. 8 to 18. Names, terms, and functions in the detailed description of a motor control method and motor control device according to a second embodiment of the present invention is based on the detailed description of each embodiment, and may be the same as or different from a motor control method and a motor control device according to a first embodiment of the present invention.

Figure 8:
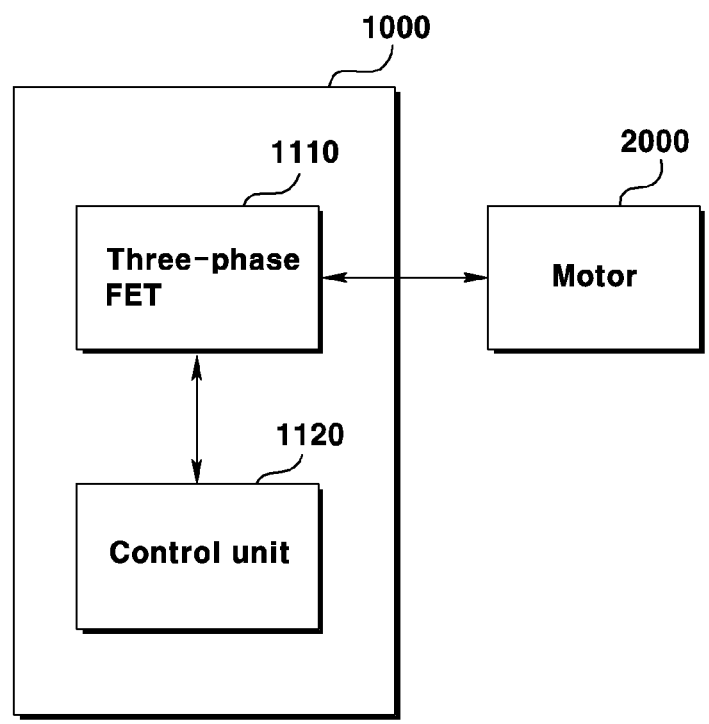
FIG. 8 is a block diagram of a motor control device according to a second embodiment of the present invention.
Figure 9:
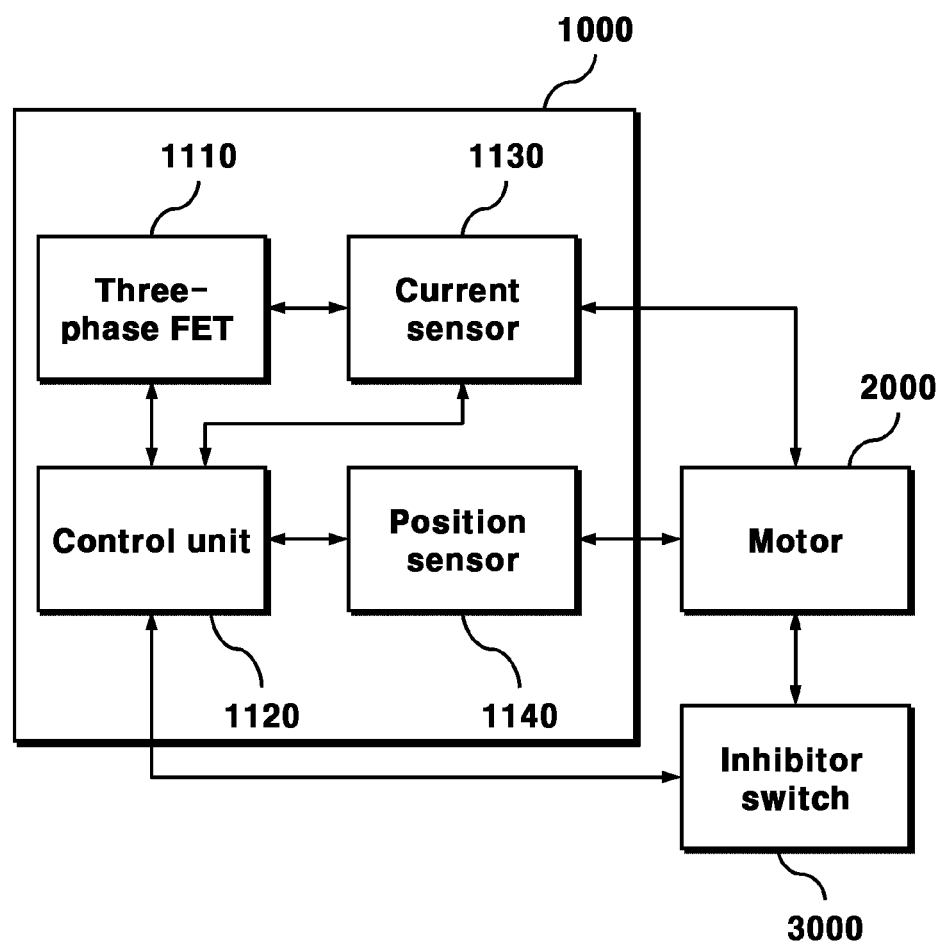
FIGS. 9 and 10 are block diagrams of a motor control device according to a second embodiment of the present invention.
Figure 10:
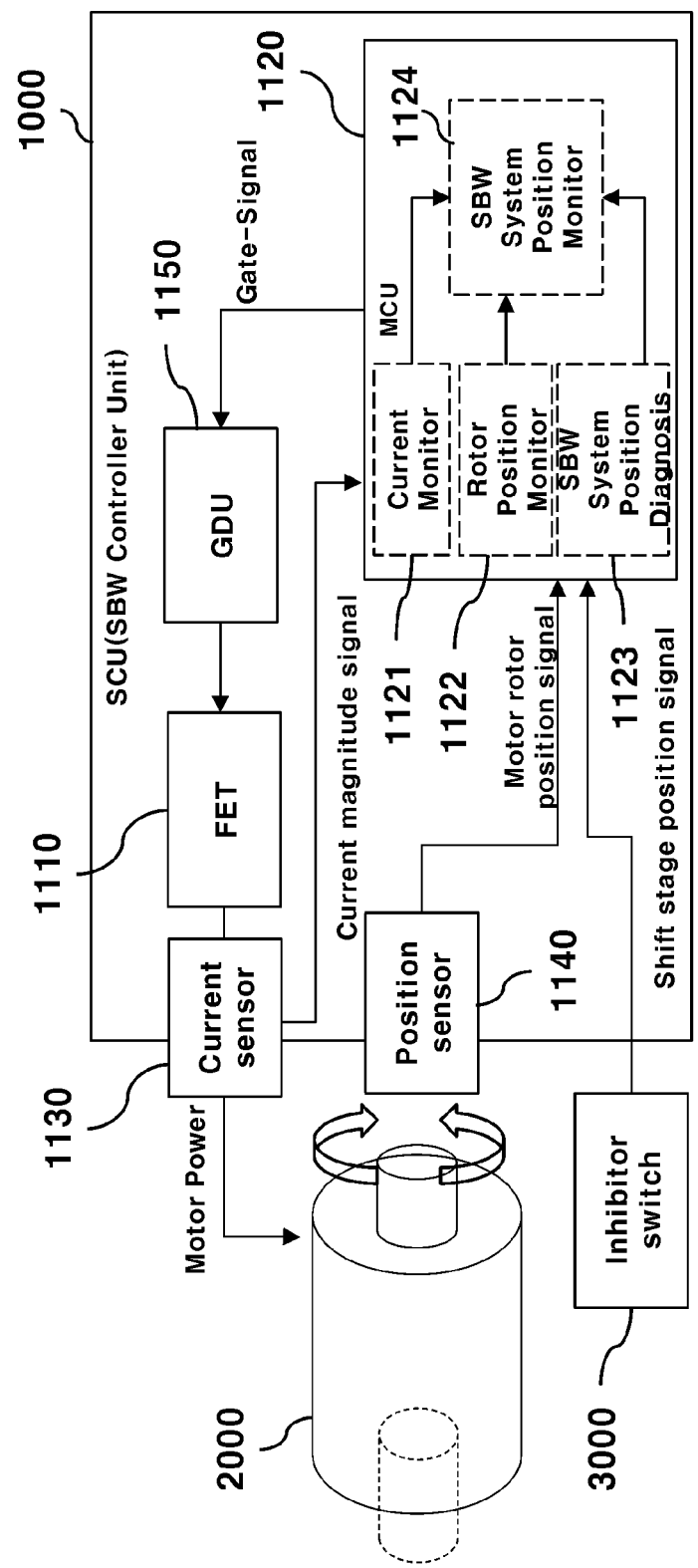

FIG. 8 is a block diagram of a motor control device according to a second embodiment of the present invention, and FIGS. 9 and 10 are block diagrams of a motor control device according to an embodiment of the present invention.

The motor control device 1000 according to a second embodiment of the present invention is configured with a three-phase FET 1110 and a control unit 1120, and may include a current sensor 1130 and a position sensor 1140, and may include a communication unit (not shown) that transmits and receives signals to and from a motor 2000 and an inhibitor switch 3000.

The motor control device 1000 according to the second embodiment of the present invention may be configured with a motor control device that drives or brakes the motor 2000 and forms a shift by wire system (hereinafter referred to as SBW). The SBW is composed of a switched reluctance motor (hereinafter referred to as SRM) and an SBW control unit (SCU), and the SRM and the SCU may be integrally formed. SRM and SCU may be configured independently. The motor control device 1000 according to a second embodiment of the present invention may operate as an SCU constituting the SBW.

The three-phase FET 1110 may operate in three phases to drive a motor that performs gear shifting.

More specifically, the three-phase FET 1110 may be configured with three FETs, and the three FETs may be configured with a three-phase bridge operating in different phases U, V, and W. The three-phase FET may be configured with six bridges. In the case it is configured with six FETs, it is configured with three upper switches and three lower switches, and the paired upper and lower switches are complementarily conducted to each other to operate the motor in three phases.

Each of the FETs constituting the three-phase FET 1110 may be a MOSFET composed of a gate, a source, and a drain, and may be turned on or off according to a gate signal applied to the gate. The three-phase FET 1110 may be three-phase commutated, two-phase commutated, or one-phase commutated, and all may be turned off.

The control unit 1120 drives the motor 2000 by controlling the three-phase FET.

More specifically, the control unit 1120 drives the motor 2000 by energizing the corresponding FET by applying a gate signal to the FET of at least one phase among the three-phase FETs. As shown in FIG. 10, the control unit 1120 may apply the gate signal to the FET through a gate driver unit (GDU) 150.

The control unit 1120 may perform initialization to set a reference position of the motor 2000 when the vehicle is started or the position of the motor 2000 needs to be initialized for accurate driving of the motor 2000. The reference position of the motor 2000 is a reference position for performing shift control, and when the reference position is not accurately set, a problem may occur in gear shifting, which may be dangerous to the driver. Therefore, the reference position of the motor 2000 must be set to an accurate position.

The control unit 1120 aligns the rotor of the motor 2000, rotates the motor 2000 in one direction, determines whether the gate signal of the current three-phase FET 1110 is the same as the previous gate signal, sets a reference current according to the number of gate signals that are currently in high state, senses the motor current, compares a motor current that has been sensed with the reference current, and when the difference between the motor current and the reference current is less than a first threshold value, sets the current position as the reference position of the motor.

The control unit 1120 first aligns the rotor of the motor 2000 in order to set a reference position of the motor 2000. At this time, when receiving a signal for starting the vehicle, the control unit 1120 may turn on one or more FETs among the three-phase FETs 1110, 1110, and 1110 to align the rotor of the motor 2000. The initial control angle of the motor may be set by aligning the rotor of the motor 2000.

Thereafter, the motor is rotated in one direction, either clockwise or counterclockwise. As it is rotated, the FET to be commutated among the three-phase FETs 1110, 1110, and 1110 changes. FETs of each phase constituting the three-phase FETs 1110, 1110, and 1110 are turned on and off in different phases. A gate signal applied to control the three-phase FET 1110 varies according to the rotation of the motor. The point that the gate signal applied to the three-phase FETs 1110, 1110, and 1110 varies during rotation is used to set a reference position.

The reference position of the motor 2000 is a position in which the motor 2000 is caught and does not rotate due to a structural stumbling block, since the rotation of the motor 2000 is stopped the gate signal applied to the three-phase FET 1110 at this time is maintained. To use this point, the control unit 1120 determines whether the current gate signal of the three-phase FET 1110 is the same as the previous gate signal. Since the gate signal exists for each phase, it is determined whether the current gate signal is the same as the previous gate signal for each phase. For example, the three-phase FET 1110 operates in U-phase, V-phase, and W-phase, and compares the current U_Gate signal, V_Gate signal, and W_Gate signal with the previous U_Gate signal, V_Gate signal, and W_Gate signal to determine whether a gate signal is the same or there is a change.

The control unit 1120 may determine whether the current gate signal maintains the same state as the previous gate signal for a preset time by individually determining the gate signal of each phase. In determining whether the current gate signal is in the same state as the previous gate signal, it may be determined whether the current gate signal maintains the same state as the previous gate signal for a preset time. The time for determining this may be set according to a period in which a gate signal is applied to the three-phase FET 1110 while the motor 2000 is being rotated. The corresponding time may vary depending on the rotation speed of the motor 2000 or may be set by a user.

When the current gate signal of the three-phase FET 1110 is the same as the previous gate signal, the control unit 1120 sets a reference current according to the number of current high gate signals, senses the motor current, and compares the motor current that has been sensed with the reference current. When the current gate signal is the same as the previous gate signal, it can be determined that the motor 2000 has stopped rotating, however, instead of immediately setting the corresponding position as the reference position, for more accurate reference position setting, it is determined whether the corresponding position corresponds to a true reference position using the reference current and the motor current. To this end, the control unit 1120 checks the number of gate signals in which the current gate signal remains high in the same state as the previous gate signal. Since the magnitude of the current flowing through the motor in the current state varies depending on the number of gate signals maintaining a high state, the gate signal in a high state is checked. A reference current is set according to the number of gate signals currently in a high state. Here, the reference current is a value stored in advance by setting a current flowing through the motor according to the number of high-state gate signals. When the battery voltage and the SRM parameter, which is a parameter of the motor, are the same, the current in a steady state is proportional to the number of FETs turned on when the gate signal becomes high, and the magnitude is constant in the same number of FETs. For example, it can be set to 9 A in one-phase having one high gate signal, and 18 A in two-phase having two high gate signals.

A motor current may be sensed by the current sensor 1130. For example, a resistor capable of measuring a current is connected to the lines of the three-phase FET 1110 and the motor 2000, and a voltage applied to the resistor is measured to sense the motor current. In addition to this, the motor current may be sensed using various current sensors 1130. The current sensor 1130 may be configured as a protection IC that detects and blocks overvoltage or overcurrent in order to protect the motor 2000.

The control unit 1120 sets the current position as a reference position of the motor when the difference between the motor current and the reference current is less than the first threshold value. That is, it is determined whether the difference is within a normal range by comparing the measured motor current with a pre-stored reference current, and when it is within the normal range, the current position is set as the reference position of the motor 2000. Here, the first threshold value may be set by a user or may vary according to specifications of the motor 2000, such as an error, a required safety level, or the like. For example, the first threshold value may be 1 A. The control unit 1120 sets the current position determined as a normal range as the reference position of the motor 2000 and uses it to control the shift position.

When the difference between the motor current and the reference current is greater than the first threshold value, the control unit 1120 may determine that the motor 2000 or the control unit 1120 has failed. As a result of comparing the measured motor current with the pre-stored reference current, when the difference is out of the normal range, it means that the current position does not correspond to the reference position of the motor 2000, or it may be determined that a failure has occurred, such as measurement of the motor current. That is, when the control unit 1120 is out of the normal range of the difference between the motor current and the reference current, it is determined that a failure of the motor 2000 or the control unit 1120 has occurred, and may be converted to a safety mode. Or, it is possible to check whether there is an error in the reference position setting process by performing the above process of aligning the motor or setting the reference position of the motor again. When it is determined that there is a failure in the motor 2000 or the control unit 1120, a failure signal may be transmitted to a host control unit.

When the reference position of the motor 2000 is set, the control unit 1120 may perform shift control based on the reference position according to a shift command inputted from a driver. The driver can receive shift commands such as P, R, N, and D signals through the electronic shift button. The control unit 1120 may perform shift control by rotating the motor 2000 so that the motor 2000 rotates to the position of the motor 2000 corresponding to each shift command based on the reference position that has been set. The control unit 1120 may apply a gate signal to the three-phase FET to rotate the motor 2000 to a target position.

The control unit 1120 determines whether the motor 2000 is rotated to a target position according to the shift. To this end, the control unit 1120 compares a first shift position measured by the position sensor 1140 with a second shift position received from the inhibitor switch 300, and when the difference between the first shift position and the second shift position is less than a second threshold value, the shift may be completed. As shown in FIG. 9, the control unit 1120 may check the first shift position through the position sensor 1140 and confirm the second shift position through the inhibitor switch 300.

The position sensor 1140 measures the position of the motor 2000. For example, the position sensor 1140 may be configured with two MR sensors formed of a dual die, and stability may be improved by using the respective position information. In addition to this, the position sensor 1140 may be implemented using various position sensors capable of measuring the position of the motor 2000. The position sensor 1140 may measure the first shift position of the current motor 2000 by measuring the current position of the motor 2000.

The inhibitor switch 300 measures the position of the shift stage. The inhibitor switch is a switch to which an electric circuit is connected within the switch when a shift lever is changed, and the second shift position in which the P, R, N, and R shift stages are engaged may be detected from the value measured by the inhibitor switch 300.

As shown in FIG. 10, the motor control device 1000 may be an SBW control unit (SCU) 100, and the control unit 1120 may be an MCU 1120. The control unit 1120 may be configured with: a current monitor 121 for monitoring the current by receiving a current magnitude signal from the current sensor 1130; a rotor position monitor 122 for receiving a motor rotor position signal from the position sensor 1140; an SBW system position diagnosis unit 123 for receiving the shift stage position signal from the inhibitor switch 300; and an SBW system position monitoring unit 124 for monitoring an SBW system position using the information of a current monitor 1121, a rotor position monitor 1122, and an SBW system position detection unit 1123.

The control unit 1120 compares a first shift position with a second shift position, and when the difference between the first shift position and the second shift position is less than a second threshold value, that is, within a normal range, the motor 2000 is determined to be exactly positioned at the target position, and the shift is completed. When the shift is completed, the motor does not rotate, so the motor 2000 is turned off. The control unit 1120 may turn off the motor 2000 by not applying a gate signal to the three-phase FET 1110. The second threshold value may be a rotation angle or a distance value. The second threshold value may be set by a user or may be set differently according to specifications of the motor 2000.

The control unit 1120 repeats the processes from the process of aligning the motor to the process of setting the current position as the reference position of the motor when the difference between the first shift position and the second shift position is greater than the second threshold value. When the first shift position and the second shift position are out of normal ranges, the control unit 1120 may determine whether the reference position setting is incorrect. To this end, the processes from the process of aligning the motor to the process of setting the current position as the reference position of the motor may be repeated.

When the number of repetitions of the processes from the process of aligning the motor to the process of setting the current position as the reference position of the motor is equal to or greater than a preset number, the control unit 1120 may determine that the position sensor 1140 or the inhibitor switch 300 has a failure. When the difference between the first shift position and the second shift position is greater than the second threshold value even after repeating the processes from the process of aligning the motor to the process of setting the current position as the reference position of the motor, it may be determined that there is a failure in the position sensor 1140 or the inhibitor switch 300 rather than the process of setting the reference position of the motor is wrong. At this time, when the number of times of repeating the processes from the process of aligning the motor to the process of setting the current position as the reference position of the motor is two or more, it may be determined that there is a failure in the position sensor 1140 or the inhibitor switch 300. It can be determined at once, that is, immediately, or after three times of checking the existence of failure.

Figure 11:
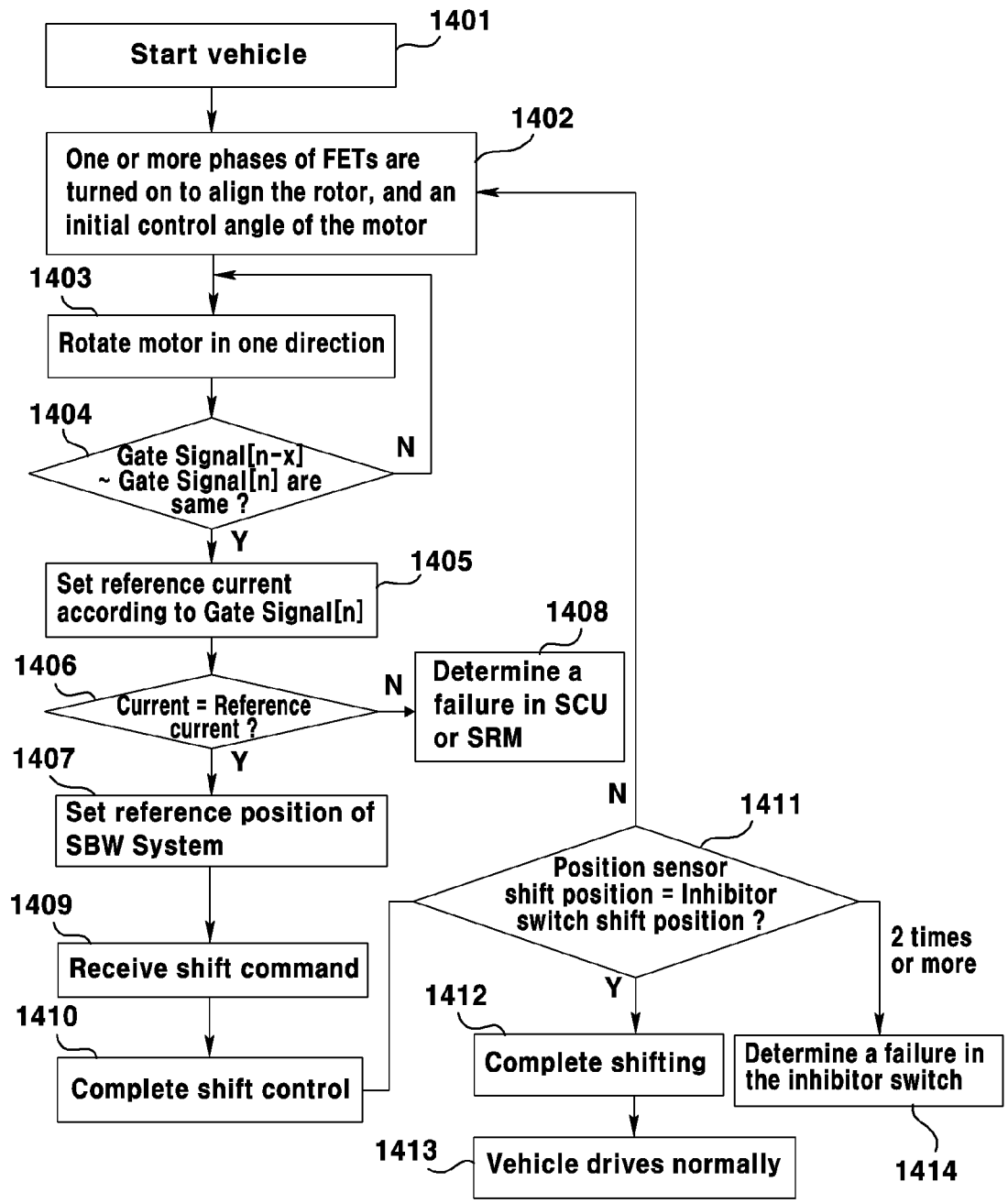
FIGS. 11 and 12 are drawings for explaining an operation of the motor control device according to a second embodiment of the present invention.
Figure 12:
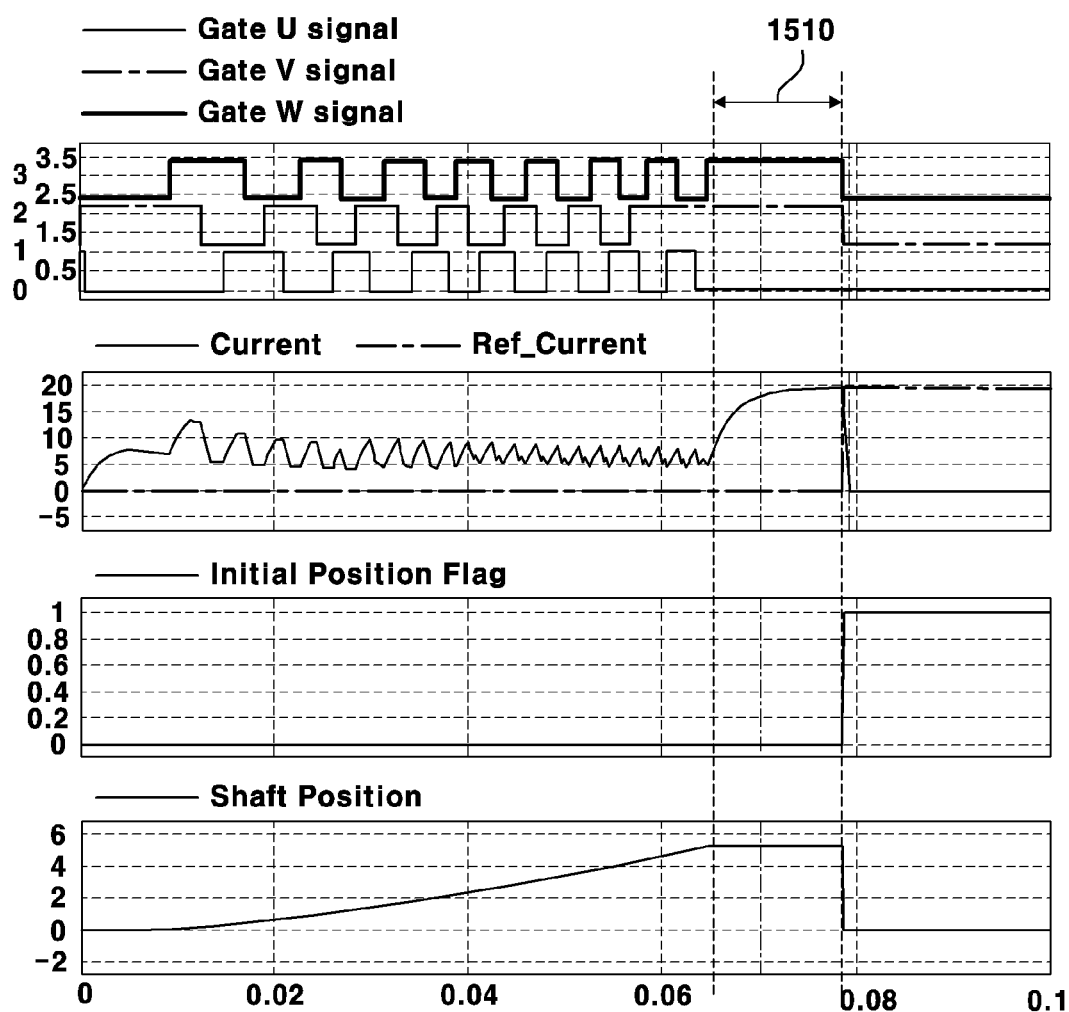

FIGS. 11 and 12 are drawings for explaining an operation of the motor control device according to a second embodiment of the present invention.

Before receiving the driver's shift command, the system must be stabilized to enable shifting. When the vehicle is started (1401), one or more phases of FETs are turned on to align the rotor, and an initial control angle of the motor (SRM) is set (1402). Thereafter, the motor is rotated (1403) in one direction (clockwise or counterclockwise). When rotating, the gate signal is compared (1404) whether x+1 signals from the previous signal n-x to the current signal n are equal. Here, the gate signal is a signal (MCU output) for turning on or off the FET, and may be a high signal or a low signal. The gate signal n is digitally expressed and means the current gate signal, and the gate signal n-x means xth previous gate signal. For example, when x is 5, it means determining whether the gate signal is the same from the 5th previous gate signal to the present, that is, whether the gate signal is maintained for 5 times. At this time, the gate signal exists for each phase U-phase, V-phase, and W-phase, and it is necessary to compare whether there is any change in the gate signal of each phase. That is, the gate signals are compared for each phase U_Gate-Signal, V_Gate-Signal, and W_Gate-Signal. The U-phase compares whether there is a change between the U-phases, the V-phase between the V-phases, and the W-phase between the W-phases. Since the gate signal is outputted from the MCU, comparison is possible through the MCU.

A reference current is set (1405) according to the number of gate signals currently in a high state. Since the amplitude of current flowing is different depending on the turned-on FET, the reference current must be set differently. If the battery voltage and SRM parameters are the same, the current in the steady state is dependent on the number of turned-on FETs and has a constant size. For example, if only the one-phase gate signal is high, the reference current may be set to 9 A, and if the two-phase gate signal is high, the reference current may be set to 18 A. When the difference between the reference current and a current value obtained from the current sensor is within the normal range (1406), the current position is set as the reference position (1407) and used for shift position control. When the difference between the reference current and a current value obtained from the current sensor is more than the normal range, it is determined that there is a failure in an SCU or SRM (1408). When the driver's shift command is received (1409), the shift control is completed (1410). The shift position difference from the position sensor and the shift position from the inhibitor switch signal are compared (1411), and when the shift positions are the same, a shift completion flag is raised (1412), and the vehicle can drive normally (1413). When the shift position is different, proceed from item (402) again. When N(No)-Loop is repeated two or more times, it is determined that there is a failure in the position sensor or the inhibitor switch (1414).

As shown in FIG. 12, the gate signal changes when the motor is aligned and rotated, and the value of the motor current continues to change according to the rotation of the motor. Thereafter, when the motor 2000 stops rotating, the gate signal is maintained (510). When the gate signal is maintained, the motor current value rises to the reference current. At (510), since the V-phase and W-phase gate signals are high, the reference current is set to 19 A, which is the two-phase reference current. After that, check that the difference between the motor current value and the reference current of 19 A is within the normal range, set a corresponding position as the reference position, raise an initial position flag, and set corresponding position and the shaft position is set to 0, which is the reference position.

Through the above process, the reference position of the motor can be accurately set by using the change amount and current of the gate signal. In addition, it can be applied regardless of the type of position sensor or current sensor, and it is possible to determine the failure in the control unit (SCU) or motor by comparing the change amount of the gate signal and the reference current. Furthermore, when shifting gears, by comparing the position sensor value obtained from the reference position and the inhibitor switch signal, it is possible to determine the failure of the position sensor or the inhibitor switch, and through this, it is possible to control the motor accurately and safely without using an expensive dual die position sensor, a position sensor equipped with a self-failure determination function, and an IC with a position sensor failure determination function.

Figure 13:
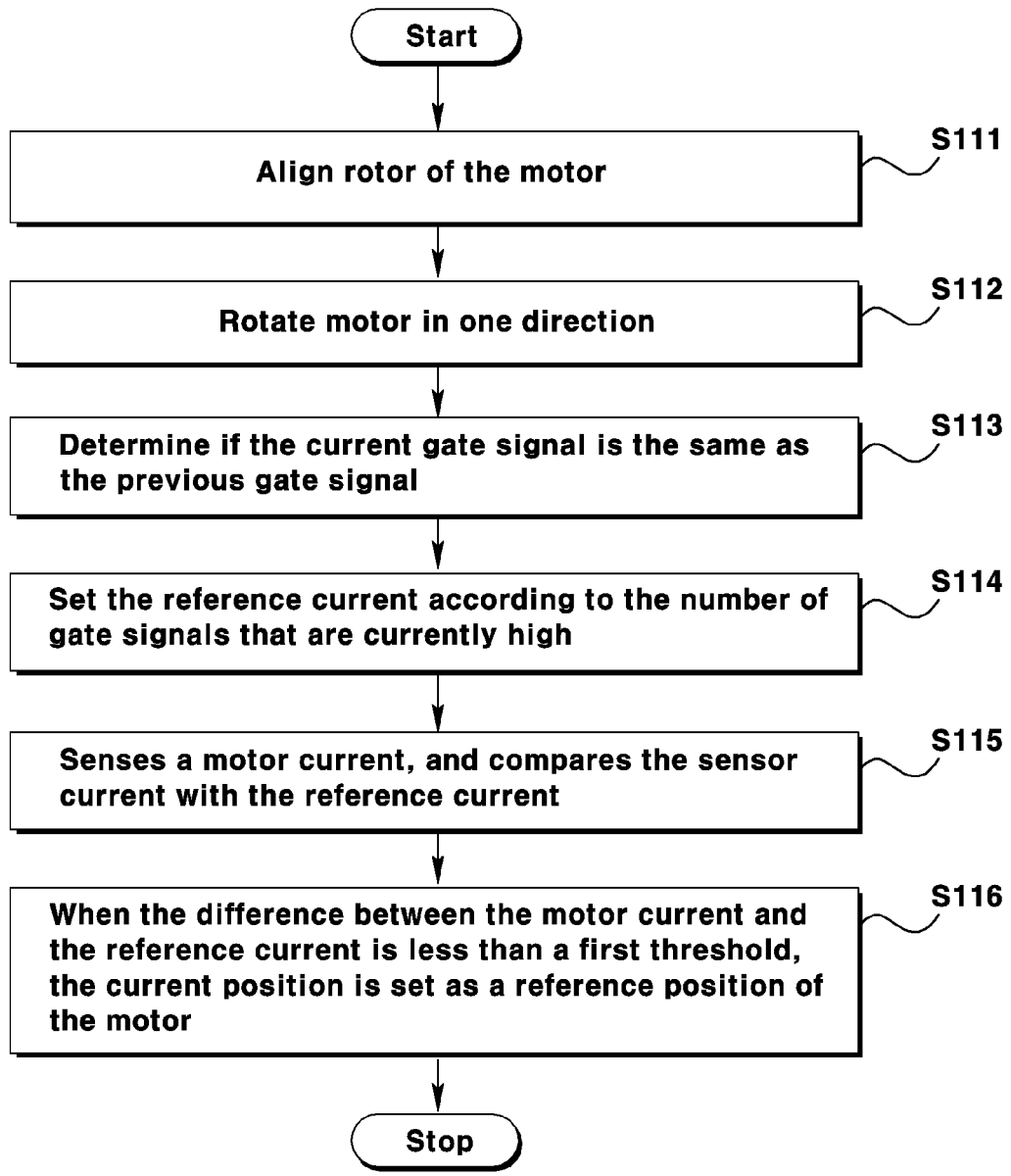
FIG. 13 is a flowchart of a motor control method according to a second embodiment of the present invention.
Figure 14:
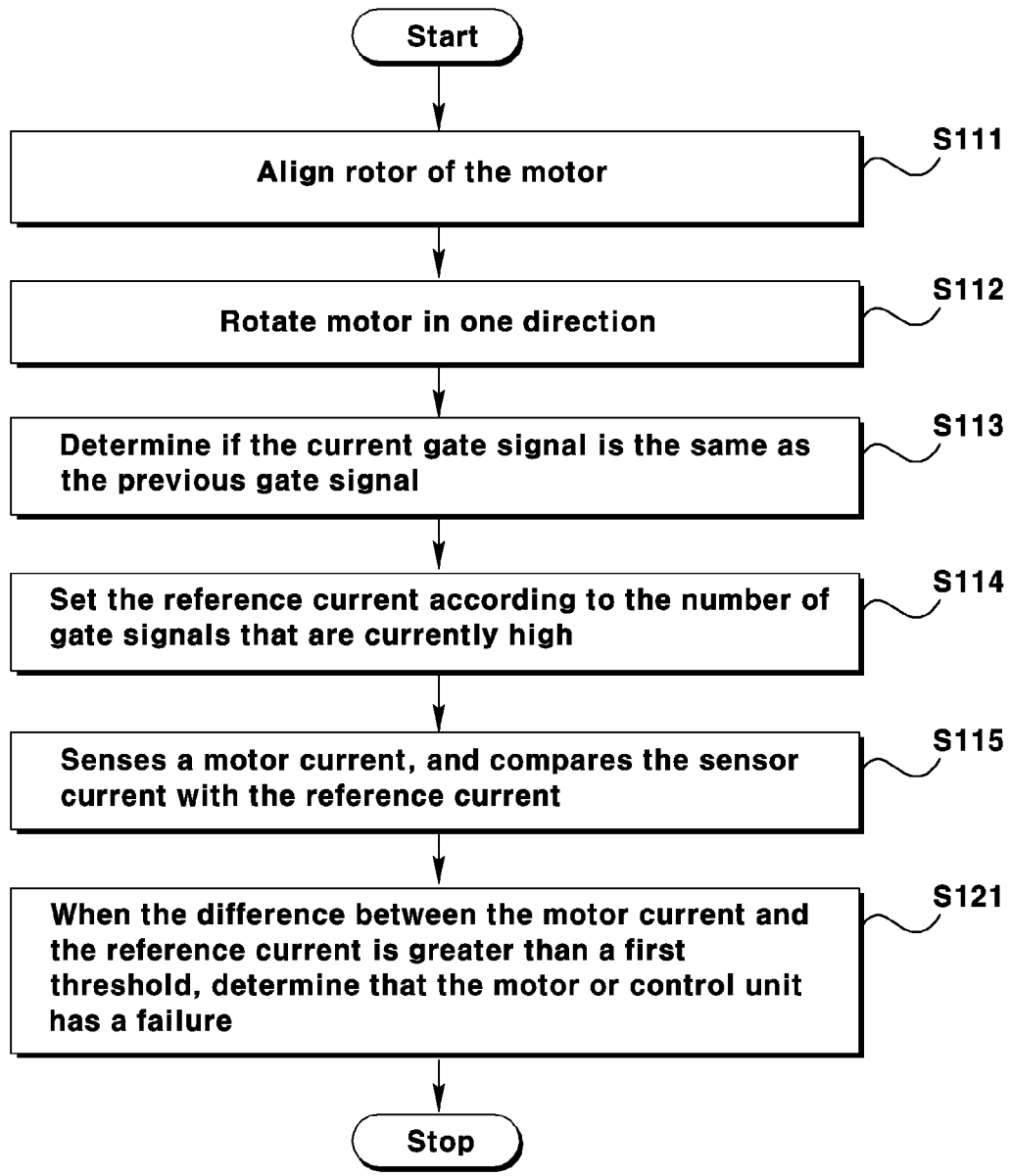
FIGS. 14 to 18 are flowcharts of a motor control method according to another embodiment of a second embodiment of the present invention.
Figure 15:
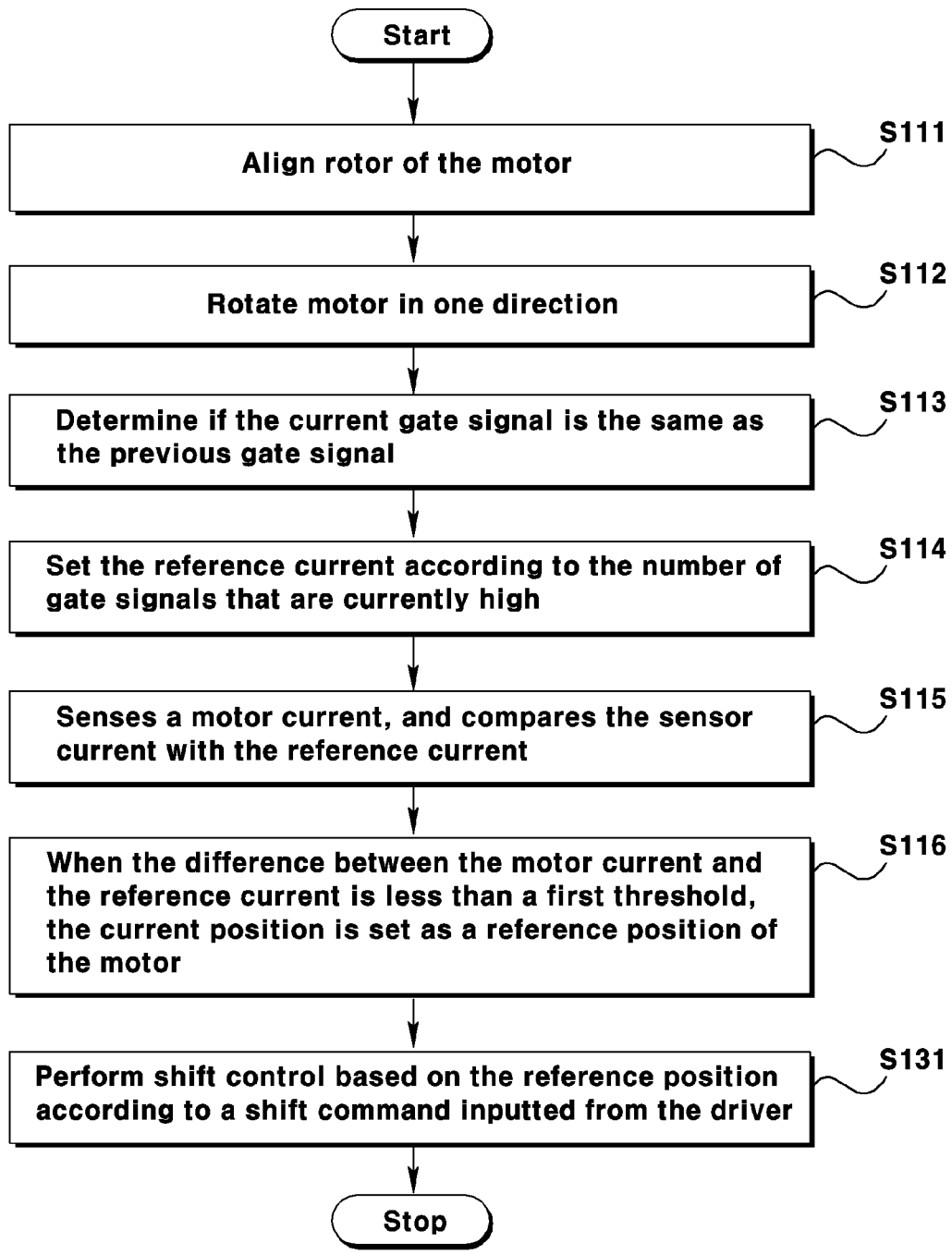
Figure 16:
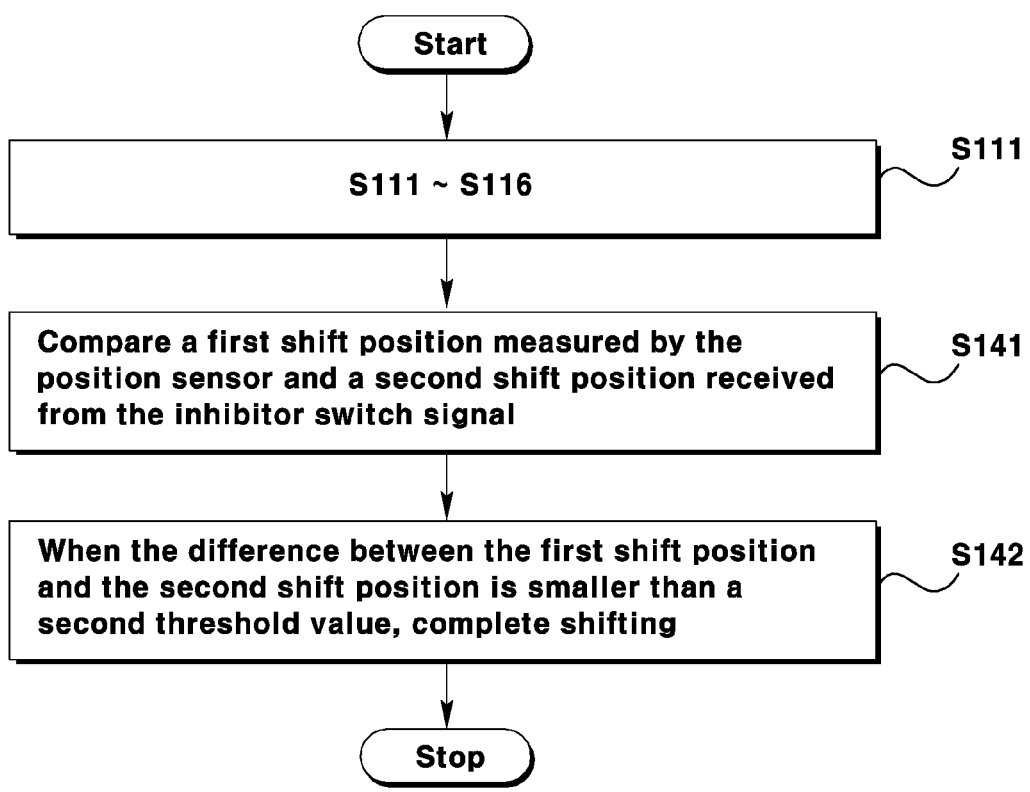
Figure 17:
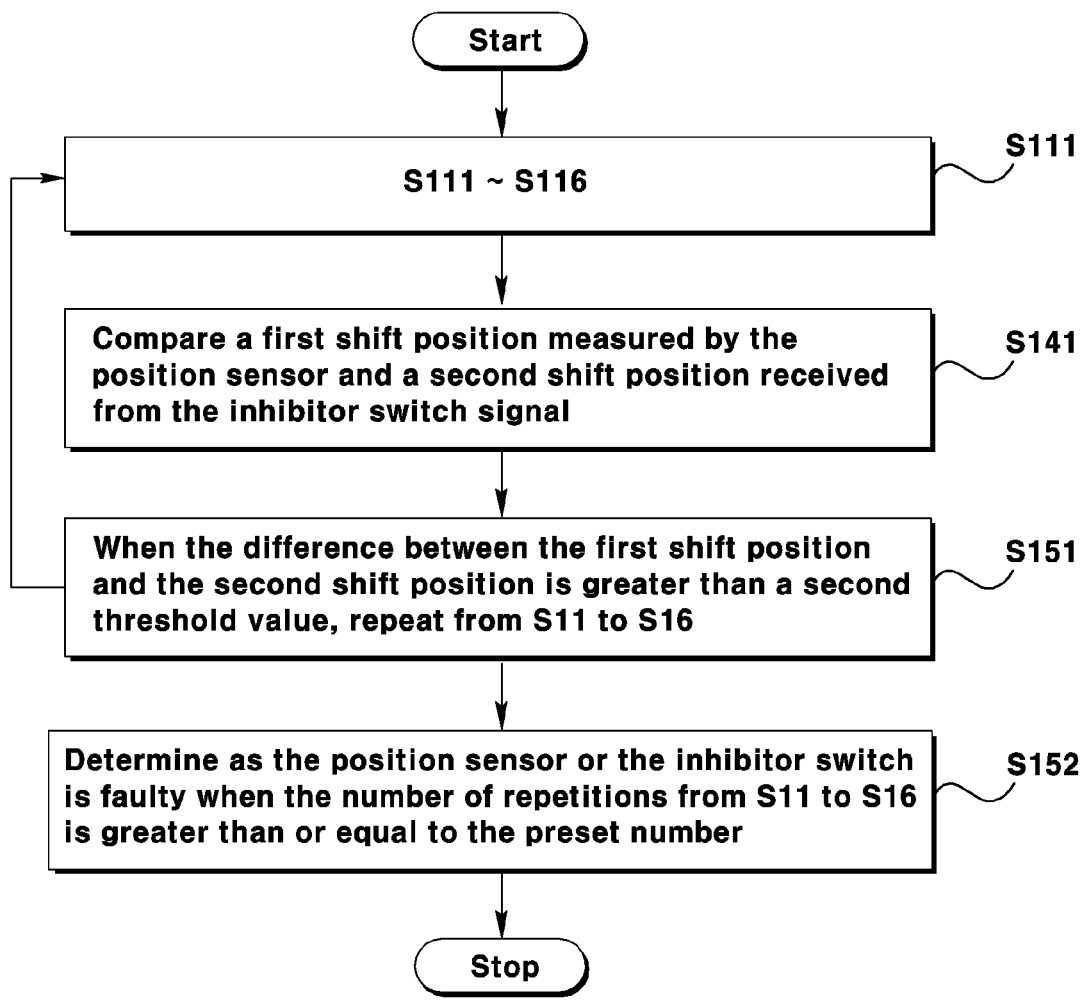
Figure 18:
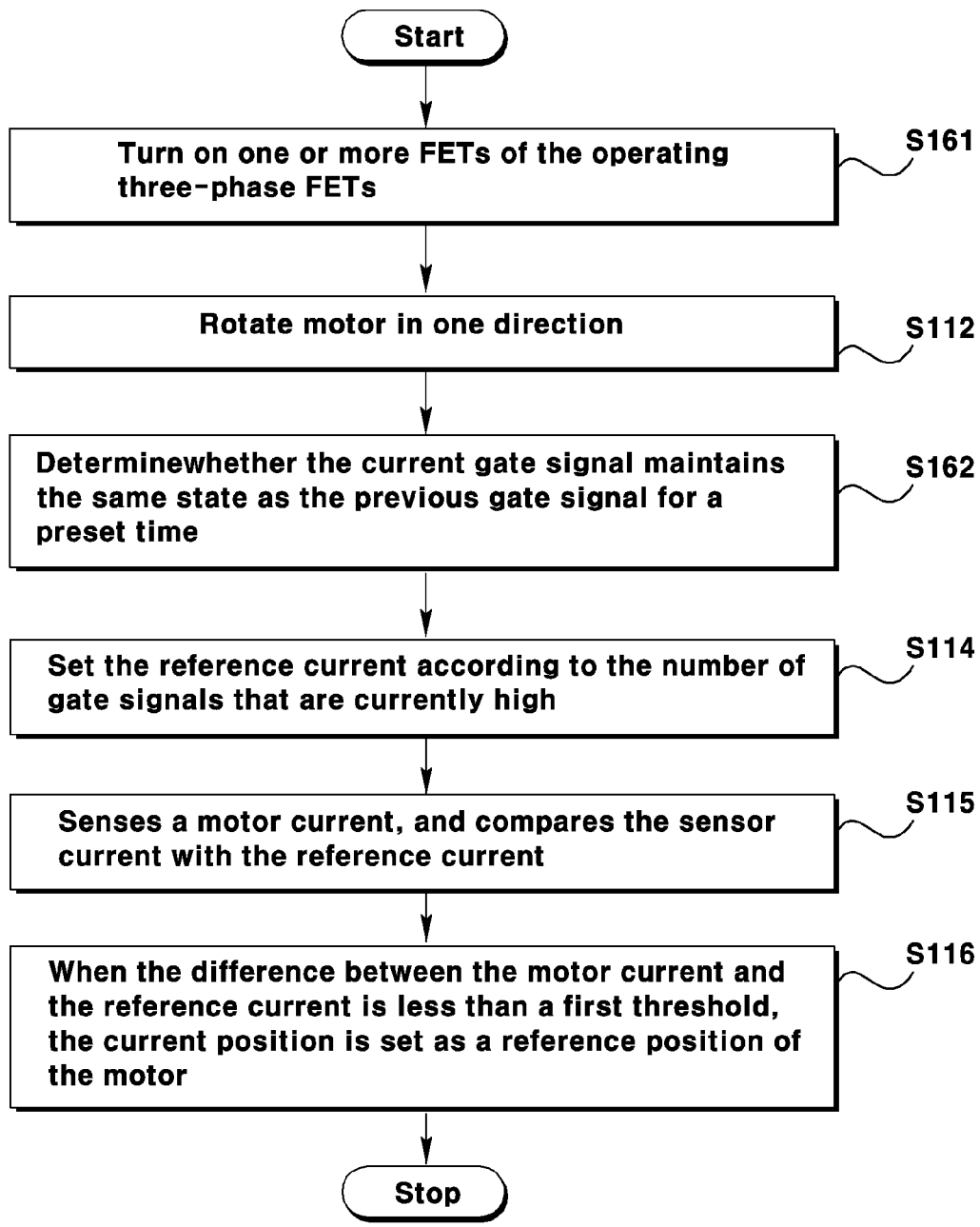

FIG. 13 is a flowchart of a motor control method according to a second embodiment of the present invention, and FIGS. 14 to 18 are flowcharts of a motor control method according to another embodiment of a second embodiment of the present invention. A detailed description of each step of the motor control method according to the second embodiment of the present invention corresponds to the detailed description of the motor control device of FIGS. 8 to 12, and thus overlapped description will be omitted.

A motor control method according to a second embodiment of the present invention performs the following steps in initializing the position of the motor.

In step S111, the rotor of the motor is aligned. Step S111 of aligning the rotor of the motor may be performed when the vehicle is started. Thereafter, the motor is rotated in one direction in step S112. At this time, the motor can be rotated clockwise or counterclockwise. The motor is rotated, and in step S113, it is determined whether the current gate signal is the same as the previous gate signal. Here, the gate signal is a gate signal applied to a three-phase FET operating in three phases to drive the motor, and it is possible to determine whether the current gate signal is the same as the previous gate signal by individually determining the gate signal of each phase. When the current gate signal is the same as the previous gate signal in step S113, a reference current is set according to the number of gate signals currently in a high state in step S114. Thereafter, the motor current is sensed in step S115, the motor current that has been sensed is compared with the reference current, and as a result of the comparison in step S115, when the difference between the motor current and the reference current is less than a first threshold value, the current position is set as the reference position of the motor in step S116.

As a result of the comparison in step S115, when the difference between the motor current and the reference current is greater than the first threshold value, it may be determined that there is a failure in the motor or the control unit in step S121.

When the current position is set as the reference position of the motor in step S116, shift control may be performed based on the reference position according to the shift command inputted from the driver in step S131.

In performing shift control based on the reference position according to the shift command inputted from the driver, the first shift position measured by the position sensor measuring the position of the motor and the second shift position received from the inhibitor switch signal are compared in step S141, and as a result of the comparison in step S141, when the difference between the first shift position and the second shift position is smaller than a second threshold value, the shift is completed in step S142.

As a result of the comparison in step S141, when the difference between the first shift position and the second shift position is greater than the second threshold value, the steps from the step of rotating the motor in one direction to the step of setting the current position as a reference position of the motor are repeated in step S151. When the number of times of repeating the steps from the step of rotating the motor in one direction to the step of setting the current position as a reference position of the motor is more than a preset number of times, it may be determined that there is a failure in the position sensor or the inhibitor switch in step S152.

The step of aligning the rotor of the motor in step S111 may include a step of turning on at least one FET among the three-phase FETs operating in three phases in step S161, and the step of determining whether the current gate signal is the same as the previous gate signal in step S113 may include a step of determining whether the current gate signal in step S162 maintains the same state as the previous gate signal for a preset time.

Modified embodiments according to the present embodiment may include some configurations of the embodiment described with reference to FIGS. 1 to 7 and some configurations of the embodiment described with reference to FIGS. 8 to 18 together. That is, modified embodiments include the embodiment described with reference to FIGS. 1 to 7, but some configurations of the embodiment described with reference to FIGS. 1 to 7 are omitted, and instead some configurations of the embodiments described with reference to corresponding FIGS. 8 to 18 may be included. Or, the modified embodiment may omit some configurations of the embodiments described with reference to corresponding FIGS. 8 to 18, but instead may include some configurations of the embodiment described with reference to FIGS. 1 to 7.

Features, structures, effects, and the like described in the above embodiments are included in at least one embodiment, and are not necessarily limited to only one embodiment. Furthermore, features, structures, effects, and the like illustrated in each embodiment can be combined or modified for other embodiments by those of ordinary skill in the art to which the embodiments belong. Accordingly, the contents related to such combinations and modifications should be interpreted as being included in the scope of the embodiments.

Meanwhile, the embodiments of the present invention can be implemented as computer-readable codes on a computer-readable recording medium. The computer-readable recording medium includes all types of recording devices in which data readable by a computer system is stored.

As examples of computer-readable recording media there are ROM, RAM, CD-ROM, magnetic tape, floppy disk, and optical data storage devices, and in addition, they are distributed across networked computer systems in a distributed manner in which computer-readable code can be stored and executed. And functional programs, codes, and code segments for implementing the present invention can be easily inferred by programmers in the technical field to which the present invention pertains.

Those of ordinary skill in the art related to the present embodiment will understand that it can be implemented in a modified form within a scope that does not deviate from the essential characteristics of the above description. Therefore, the disclosed methods are to be considered in an illustrative rather than a restrictive sense. The scope of the present invention is indicated in the claims rather than the foregoing description, and all differences within the scope equivalent thereto should be construed as being included in the present invention.

The invention claimed is:
1. A motor control method comprising the steps of:
performing three-phase commutation in a first range section of a motor rotation speed in a brake mode of a motor;
performing two-phase commutation in a second range section of the motor rotation speed;

performing one-phase commutation in a third range section of the motor rotation speed; and turning off commutation when the motor rotation speed is less than or equal to the first range section.

2. The motor control method according to claim 1, wherein the first range section is set above three-phase commutation sustaining speed being calculated from the motor rotation speed at start of the brake mode and the three-phase commutation sustaining speed ratio, wherein the second range section is set above two-phase commutation sustaining speed being calculated from the motor rotation speed at the start of the brake mode, the three-phase commutation sustaining speed ratio, and the two-phase commutation sustaining speed ratio, and wherein the third range section can be set above one-phase commutation sustaining speed calculated from the motor rotation speed at the start of the brake mode, the three-phase commutation sustaining speed ratio, the two-phase commutation sustaining speed ratio, and the one-phase commutation sustaining speed ratio.

3. The motor control method according to claim 2, wherein the three-phase commutation sustaining speed ratio is greater than the two-phase commutation sustaining speed ratio, and the two-phase commutation sustaining speed ratio is greater than the one-phase commutation sustaining speed ratio.

4. The motor control method according to claim 1, wherein the brake mode comprises a normal brake mode and an emergency brake mode.

5. The motor control method according to claim 4, wherein a first range section in the emergency break mode is larger than a first range section in the normal break mode.

6. The motor control method according to claim 4, wherein the emergency brake mode is performed by detecting any one of DC current abnormality, motor current abnormality, PWM failure, function failure, motor rotation abnormality, and signal reception of a host control unit.

7. The motor control method according to claim 1, wherein during the three-phase commutation, all three MOSFETs are commutated, wherein during the two-phase commutation, two MOSFETs that generate a reverse torque opposite to a rotational direction of a motor are commutated, and wherein during the one-phase commutation, one MOSFET generating reverse torque opposite to a rotation direction of a motor is commutated.

8. A motor control device comprising:
a three-phase bridge unit comprising three MOSFETs operating in different phases so that the motor operates in three-phase; and
a control unit for controlling the three MOSFETs,
wherein during a brake mode of a motor, the control unit performs three-phase commutation in a first range section of a motor rotation speed, performs two-phase commutation in a second range section of the motor rotation speed, performs one-phase commutation in a third range section of the motor rotation speed, and turns off commutation when the motor rotation speed is less than or equal to the third range section.

9. The motor control device according to claim 8, wherein the control unit sets the first range section to be greater than or equal to a three-phase commutation sustaining speed calculated from a motor rotation speed at start of a brake mode and a three-phase commutation sustaining speed ratio, wherein the control unit sets the second range section to be greater than or equal to the two-phase commutation sustaining speed calculated from the motor rotation speed at the start of the brake mode, the three-phase commutation sustaining speed ratio, and the two-phase commutation sustaining speed ratio, and wherein the control unit sets the third range section to be greater than or equal to one-phase commutation sustaining speed calculated from the motor rotation speed at the start of the brake mode, the three-phase commutation sustaining speed ratio, the two-phase commutation sustaining speed ratio, and the one-phase commutation sustaining speed ratio.

10. The motor control device according to claim 8, wherein the break mode comprises a normal break mode and an emergency break mode, and wherein a first range section in the emergency break mode is larger than a first range section in the normal break mode.

11. The motor control device according to claim 8, wherein the control unit performs an emergency brake mode by detecting any one of a DC current abnormality, a motor current abnormality, a PWM failure, a function failure, a motor rotation abnormality, and a signal reception of a host control unit.

12. The motor control device according to claim 8, comprising:
a motor position measuring unit comprising a first sensor and a second sensor for measuring the motor position;
a motor driving unit configured to receive a control signal from the control unit and output a PWM signal to the three-phase bridge unit;
a power supply unit configured to supply power to the control unit, receive a first motor rotation position signal from the first sensor, and transmit the first motor rotation position signal to the control unit; and
an input terminal protection unit configured to block voltage supplied to the motor or detect overcurrent.

13. The motor control device according to claim 12, wherein the control unit receives a second motor rotation position signal from the second sensor and determines a functional failure by comparing it with the first motor rotation position signal received from the power supply unit.

14. The motor control device according to claim 12, wherein the control unit perform an emergency brake mode when detecting an abnormal DC current from the input terminal protection unit.

15. The motor control device according to claim 12, wherein the control unit perform an emergency brake mode when detecting motor current abnormality from the three MOSFETs.

16. The motor control device according to claim 12, wherein the control unit perform an emergency brake mode when detecting a PWM failure from the motor driving unit.

17. The motor control device according to claim 12, wherein the control unit perform an emergency brake mode when detecting a motor rotation abnormality from the power supply unit.

18. The motor control device according to claim 8, wherein during the three-phase commutation, all three MOSFETs are commutated.

19. The motor control device according to claim 8, wherein during the two-phase commutation, two MOSFETs that generate a reverse torque opposite to a rotational direction of a motor are commutated.

20. The motor control device according to claim 8, wherein during the one-phase commutation, one MOSFET generating reverse torque opposite to a rotation direction of a motor is commutated.

* * * * *